(12) United States Patent
Gani et al.

(10) Patent No.: US 12,364,038 B2
(45) Date of Patent: Jul. 15, 2025

(54) SENSOR DIE PACKAGE

(71) Applicants: STMICROELECTRONICS LTD, Kowloon (HK); STMICROELECTRONICS PTE LTD, Singapore (SG)

(72) Inventors: David Gani, Choa Chu kang (SG); Yiying Kuo, Taoyuan (TW)

(73) Assignees: STMICROELECTRONICS LTD, Kowloon (HK); STMICROELECTRONICS PTE LTD, Singapore (SG)

( * ) Notice: Subject to any disclaimer, the term of this patent is extended or adjusted under 35 U.S.C. 154(b) by 641 days.

(21) Appl. No.: 17/556,604

(22) Filed: Dec. 20, 2021

(65) Prior Publication Data
US 2022/0208819 A1 Jun. 30, 2022

Related U.S. Application Data

(60) Provisional application No. 63/131,704, filed on Dec. 29, 2020.

(51) Int. Cl.
*H10F 39/00* (2025.01)
*H01L 23/31* (2006.01)
*H01L 23/498* (2006.01)
(Continued)

(52) U.S. Cl.
CPC ....... *H10F 39/804* (2025.01); *H01L 23/3171* (2013.01); *H01L 23/49822* (2013.01);
(Continued)

(58) Field of Classification Search
CPC . H01L 2224/29009; H01L 2225/06541; H01L 2224/05009; H01L 23/3171;
(Continued)

(56) References Cited

U.S. PATENT DOCUMENTS 7,851,246 B2 12/2010 Camacho et al.
8,097,489 B2 1/2012 Pagaila et al.
(Continued)

FOREIGN PATENT DOCUMENTS

CN 101262002 A 9/2008
CN 103456754 A 12/2013
(Continued)

*Primary Examiner* — Alia Sabur
(74) *Attorney, Agent, or Firm* — Seed IP Law Group LLP

(57) ABSTRACT

The present disclosure is directed to a package that includes a transparent layer that is on and covers a sensor of a die as well as a plurality of electrical connections that extend from a first surface of the package to the second surface of the package opposite to the first surface. In at least one embodiment of a package, the electrical connections each include a conductive structure that extends through the transparent layer to a first side of a corresponding contact pad of the die, and at least one electrical that extends into the second surface of the die to a second side of the corresponding contact pad that is opposite to the first side. In at least another embodiment of a package, the electrical connections include a conductive structure that extends through a molding compound to a first side of a corresponding contact pad of the die, and at least one electrical via that extends into the second surface of the die to a second side of the corresponding contact pad opposite to the first side.

19 Claims, 14 Drawing Sheets

(51) Int. Cl.
  *H10F 71/00* (2025.01)
  *H10F 77/00* (2025.01)
(52) U.S. Cl.
  CPC .......... *H10F 39/011* (2025.01); *H10F 39/811* (2025.01); *H10F 71/00* (2025.01); *H10F 77/93* (2025.01)
(58) Field of Classification Search
  CPC ......... H01L 2224/04105; H10F 39/804; H10F 39/811; H10F 39/805; H10F 77/93
  See application file for complete search history.

(56) References Cited

U.S. PATENT DOCUMENTS

| | | |
|---|---|---|
| 9,368,438 B2 | 6/2016 | Lin et al. |
| 9,583,666 B2 | 2/2017 | Luan |
| 9,711,458 B2 | 7/2017 | Yu et al. |
| 2009/0166785 A1* | 7/2009 | Camacho .......... H01L 27/14618 257/E31.124 |
| 2011/0177643 A1 | 7/2011 | Chiu et al. |
| 2013/0320471 A1* | 12/2013 | Luan ................ H01L 27/14618 257/E31.127 |
| 2016/0071779 A1* | 3/2016 | Chen ................ H01L 21/76885 257/787 |
| 2018/0102321 A1* | 4/2018 | Ho .......................... H01L 24/05 |

FOREIGN PATENT DOCUMENTS

| | | |
|---|---|---|
| CN | 105789147 A | 7/2016 |
| CN | 207425857 U | 5/2018 |
| CN | 109698208 A | 4/2019 |

\* cited by examiner

SENSOR DIE PACKAGE

BACKGROUND

Technical Field

The present disclosure is directed to a package with a sensor die.

Description of the Related Art

Generally, semiconductor device packages, such as chip scale packages, wafer level chip scale packages (WLCSPs), or wafer level packages (WLPs), contain semiconductor devices, semiconductor die, or integrated circuit die that are encased in a molding compound, a polymer, an encapsulant, etc. The semiconductor devices, semiconductor die, or integrated circuit die may be sensors configured to detect any number of quantities or qualities, or may be controllers utilized to control various other electronic components. For example, such semiconductor device packages may detect light, temperature, sound, pressure, stress, strain or any other quantities or qualities. Other semiconductor devices, semiconductor die, or integrated circuit die may be controllers, microprocessors, memory, or some other type of semiconductor device, semiconductor die, or integrated circuit die.

A conventional WLCSP that detects light by a light sensor is formed to include conductive pads to which a solder material is directly coupled such that the conventional WLCSP may be mounted to an electronic device (e.g., laptop, smartphone, tablet, gaming console, calculator, computer, printed circuit board (PCB), etc.). Usually, the solder material is in the form of solder balls (e.g., ball-grid array) and are only on a single side of the conventional WLCSP. On a second side of the conventional WLCSP, a transparent material covers the light sensor and exposes the light sensor to an external environment such that light passes through the transparent material and reaches the light sensor.

When the conventional WLCSP are mounted within an electronic device or to a PCB, the transparent material of the conventional WLCSP remains uncovered to expose the light sensor to light through the transparent material. Other conventional packages cannot be stacked on or coupled to the second surface of the conventional WLCSP as there are no electrical contacts or connections at the second side of the conventional WLCSP. As such, a relatively large amount of space is provided within the electronic device to accommodate the conventional WLCSP. Further, as other conventional packages cannot be stacked on the second side of the conventional WLCSP, additional space is provided to accommodate the other conventional packages as well.

Generally, electrical connections formed in the conventional WLCSP with the light sensor are usually formed by electrical wires, electrical traces, or a combination of both. The electrical wires or traces communicate electrical signals and electrical power to the sensor die within the conventional WLCSP from an external power source. As the electrical wires and traces are increased in length, the electrical resistance increases due to the increased distance in length of the electrical wires and traces. As the electrical wires and traces are increased in length, the distance that an electrical signal or electrical power travels to reach active components (e.g., a die) within the conventional WLCSP is increased as well. This increase in electrical resistance and distance increases the overall time that the electrical signal or electrical power has to travel to reach the sensor die, which ultimately increases electrical impedance and parasitic inductance within the conventional WLCSP. The increase in electrical impedance and parasitic inductance increases the amount of noise within the electrical signal or the electrical power communicated through the electrical wires and traces to the sensor die within the conventional WLCSP.

Other conventional packages that include a light sensor include interstitial ball grid array (iBGA) packages, optically enabled ball grid array (OBGA) packages, through silicon via (TSV) packages, and CPACK packages, usually only have solder balls or electrical contact pads (e.g., external electrical connections) on a first side of the package.

BRIEF SUMMARY

Embodiments of the present disclosure overcome significant challenges associated with the conventional WLCSPs that have light sensors and only having solder balls on a single side as discussed earlier. One significant challenge is to reduce the overall profile of semiconductor device packages while accommodating a WLCSP with a light sensor and other packages within an electronic device or on a PCB.

Another significant challenge is providing a WLCSP that has electrical connections within the WLCSP that are relatively short in length to reduce electrical resistance, electrical impedance, and parasitic inductance as well as reduce the effects of other potential power integrity issues within the WLCSP.

The present disclosure is directed to various embodiments of semiconductor device packages that include a first surface and a second surface opposite to the first surface, at least one die within the packages, and electrical connections that extend from the first side to the second side of the package and extend through the die as well.

In some embodiments of the packages of the present disclosure, the die includes a light sensor that is covered and protected by a transparent material (e.g., a transparent epoxy, a transparent polymer, a transparent glass, a transparent substrate, etc.) that allows light to pass through unimpeded from an external environment to the light sensor. The transparent material is on a first surface of the die. The transparent material includes a plurality of sidewalls and a first dimension that extends between opposite ones of the plurality of sidewalls of the transparent material. The die includes a plurality of sidewalls and a second dimension that extends between opposite ones of the plurality of sidewalls of the die. The first dimension and the second dimension are substantially equal to each other and ones of the plurality of sidewalls of the transparent material are aligned or coplanar with corresponding ones of the plurality of sidewalls of the die.

In some embodiments, the first dimension may be less than the second dimension. In these embodiments, a conductive structure extends from a contact pad of a die through a molding compound to a third surface of the molding compound. The conductive structure is laterally adjacent to a transparent material on the die covering a light sensor of the die.

A through silicon via (TSV) or electrical via extends into the second surface of the die to a contact pad at the first surface of the die. A conductive structure extends from the contact pad to a third surface of the transparent material. The third surface faces away from the die. The TSV, the contact pad, and the conductive structure form an electrical connection that extends directly from the first surfaces of the packages to the second surfaces of the packages.

A method of manufacturing the electrical connections that extend from the first surfaces of the packages to the second surfaces of the packages includes forming a transparent material on a surface of a wafer and forming conductive structures on contact pads at the surface of the wafer. The method also includes forming a plurality of die by singulating the wafer, the transparent material, and the conductive structures. The method includes coupling the plurality of die to a temporary carrier, forming a molding compound covering sidewalls of the plurality of die, removing the molding compound and the plurality of die from the temporary carrier, and flipping the molding compound and the plurality of die. The method further includes coupling the flipped molding compound and the plurality of die to another temporary carrier, forming a plurality of through silicon vias extending into the plurality of die, and forming embodiments of the WLCSPs as disclosed within in the present disclosure by singulating the plurality of die and the molding compound.

The embodiments of the WLCSPs in the present disclosure do not have wires like conventional WLCSPs. Instead, in the WLCSPs of the present disclosure, the electrical connections are relatively short in length as compared to electrical wires and traces in the conventional WLCSPs. This relative shortness reduces the electrical resistance, electrical impedance, and parasitic inductance within the WLCSPs of the present disclosure. This reduction in these various characteristics reduces the effects of power integrity issues within the WLCSPs of the present disclosure as compared to the conventional WLCSPs. While this reduction in electrical resistance, electrical impedance, and parasitic inductance within a single WLCSP may seem relatively small within an electronic device that includes the WLCSPs of the present disclosure as a whole, as the number of WLCSPs within or on an electronic device. The combined effects of these multiple WLCSPs due to power integrity issues and noise caused by the combination of WLCSPs within or on the electronic device is vastly increased when multiple conventional WLCSPs are utilized instead of the embodiments of the WLCSPs of present disclosure.

The shorter the electrical connections results in the embodiments of the WLCSPs of the present disclosure being less thick than the conventional WLCSPs.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify similar elements or acts unless the context indicates otherwise. The sizes and relative proportions of the elements in the drawings are not necessarily drawn to scale. For example, some of these elements may be enlarged and positioned to improve drawing legibility.

DETAILED DESCRIPTION

Figure 1A:
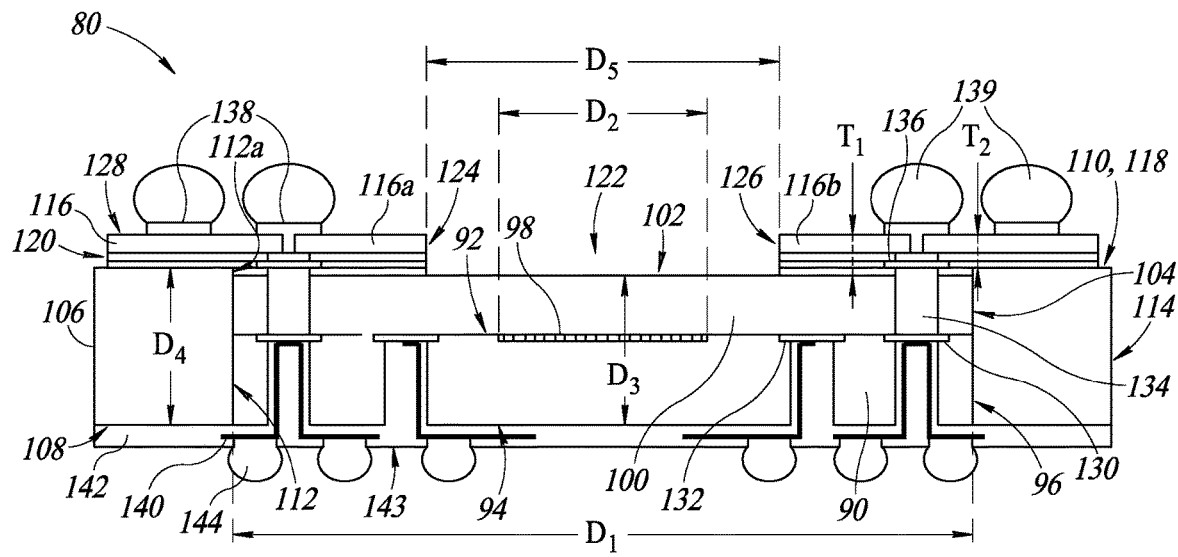
FIG. 1A is a cross-sectional view of an embodiment of a package taken along line A-A in FIG. 1B.

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "left," and "right," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences when a package is manufactured in the real world, as nothing can be made perfectly equal or perfectly the same. In other words, substantially means that there may be some slight variation in actual practice and instead is made within accepted tolerances.

As used in this specification and the appended claims, the singular forms "a," "an," and "the" include plural referents unless the content clearly dictates otherwise.

While various embodiments are shown and described with respect semiconductor die and semiconductor packages with a light sensor, it will be readily appreciated that embodiments of the present disclosure are not limited thereto. In various embodiments, the structure, devices, methods, and the like described herein may be embodied in or otherwise utilized in any suitable type or form of semiconductor die or packages, and may be manufactured utilizing any suitable semiconductor die and packaging technologies as desired.

In the present disclosure, embodiments of semiconductor packages include a molding compound covering sidewalls of a transparent material and sidewalls of a die. The packages include a first side and a second side that is opposite to the first side, and an electrical connection that extends from the first side to the second side directly through the packages. In other words, the electrical connection extends entirely and completely through the package from the first side to the second side opposite to the first side. The transparent material may have a first dimension extending between opposite ones of the sidewalls of the transparent material, and the die may have a second dimension extending between opposite ones of the sidewalls of the die. In some embodiments, the first dimension is substantially equal to the second dimension such that ones of the sidewalls of the die align with corresponding ones of the sidewalls of the transparent material. In other embodiments, the first dimension is less than the second dimension such that ones of the sidewalls of the transparent material are spaced inwardly from ones of the sidewalls of the die.

The electrical connections extending entirely or completely through the package from the first side of the package to the second side of the package reduces the effects of power integrity issues caused by electrical resistance, electrical impedance, and parasitic inductance within the WLCSPs set forth in the present disclosure as compared to conventional WLCSPs that utilize electrical wires and traces to and from electrical connections within the conventional WLCSPs as discussed earlier. The reduction in the effects of power integrity issues is at least partially due to a length of the electrical connection within the WLCSPs within the present disclosure being less than the length of the electrical wires and traces in combination with other electrical connection components within the conventional WLCSPs. Further details of this reduction in the effects of power integrity issues will be discussed in greater detail within the present disclosure as follows.

Figure 1B:
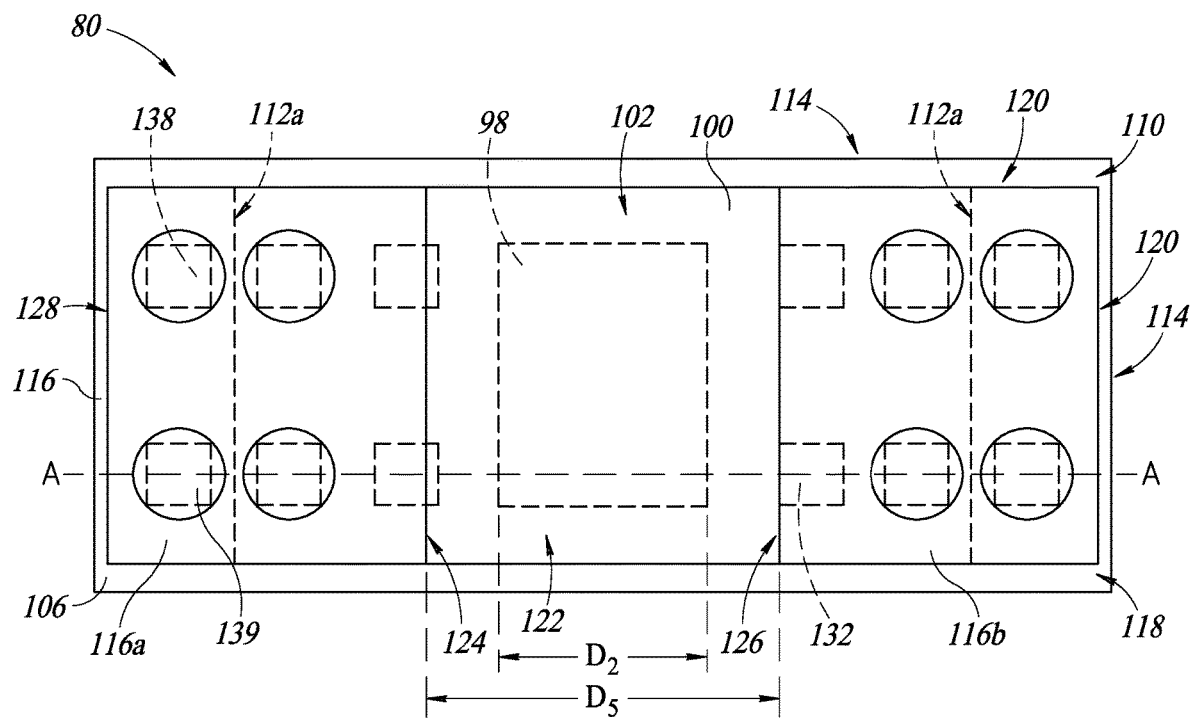
FIG. 1B is directed to a top-plan view of the embodiment of the package as shown in FIG. 1A.

FIG. 1A is a cross-sectional view of an embodiment of a package 80 taken along line A-A in FIG. 1B. The package 80 includes a die 90 including a first surface 92 and a second surface 94 opposite to the first surface 92, and a plurality of sidewalls 96 that extend from the first surface 92 to the second surface 94. The die 90 includes a dimension $D_1$ that extends between opposite ones of plurality of sidewalls 96.

The die 90 includes a sensor 98 at the first surface 92 of the die 90. In this embodiment of the package 80 and the purposes of the following discussion, the sensor 98 is a light sensor 98. However, in some other embodiments, the sensor 98 may be a vibrational sensor, a sound sensor, or some other sensor configured to detect a quantity or quality of an external environment other than light.

The sensor 98 will be referred to as the light sensor 98 within the present disclosure. The light sensor 98 may be a pixel array, a photoresistor, a photodiode, a phototransistor, a micro-electromechanical (MEMS) system, or some other type of sensor configured to detect light and output an electrical signal based on the detection. The light sensor 98 has a dimension $D_2$ that extends between opposite ends of the light sensor 98.

A transparent layer 100 is on the first surface 92 of the die 90 and covers the light sensor 98. The transparent layer 100 may be a transparent epoxy, a transparent polymer, a transparent glass, a transparent substrate, a transparent portion, a transparent structure, or some other material that light may pass through to reach the light sensor 98. The transparent layer 100 includes a surface 102 and a plurality of sidewalls 104 that extend from the first surface 92 of the die 90 to the surface 102. Ones of the plurality of sidewalls 104 of the transparent layer 100 are aligned with corresponding ones of the plurality of sidewalls 96 of the die 90. The transparent layer 100 has the dimension $D_1$ between opposite ones of the plurality of sidewalls 104 of the transparent layer 100.

The surface 102 of the transparent layer 100 has a first surface area that is substantially equal to a second surface area of the first surface 92 of the die 90. However, in some other embodiments, the first surface area of the surface 102 of the transparent layer 100 may be less than the second surface area of the first surface 92 of the die 90.

In some other embodiments, a dimension between opposite ones of the plurality of sidewalls 104 of the transparent layer 100 may be less than a dimension between opposite ones of the plurality of sidewalls 96 of the die 90.

A dimension $D_3$ extends from the second surface 94 of the die 90 to the surface 102 of the transparent layer 100. The dimension $D_3$ is substantially equal to the summation of dimensions of the sidewalls 96, 104 of the die 90 and the transparent layer 100 parallel with the dimension $D_3$.

A molding compound 106 covers the sidewalls 96, 104 of the die 90 and the transparent layer 100. The molding compound 106 may be an epoxy material, a polymer material, a composite material, a dielectric material, or some other electrically non-conductive material or electrically insulating material. The molding compound 106 is an opaque material that light cannot pass through, and, instead, the light may be reflected off or absorbed by the opaque material. For example, the molding compound 106 may have a pigment such as black carbon pigment partially making up the composition of the molding compound to stop light from passing through the molding compound 106. The molding compound 106 has a third surface 108 and a fourth surface 110 that is opposite to the third surface 108. The third surface 108 is substantially coplanar and flush with the second surface 94 of the die 90. The molding compound includes inner sidewalls 112 and outer sidewalls 114. The outer sidewalls 114 partially form an outer surface of the package 80 and are spaced further from a center of the package 80 than the inner sidewalls 112.

A dimension $D_4$ extends from the third surface 108 to the fourth surface 110 of the molding compound 106. The dimension $D_4$ is greater than the dimension $D_3$. This difference between the dimension $D_4$ and the dimension $D_3$ results in a lip portion 112a at the inner sidewalls 112 of the molding compound 106 protruding and extending from the surface 102 of the transparent layer 100. The lip portion 112a at the inner sidewalls 112 is not covered by the die 90 or the transparent material 100. Instead, the lip portion 112a is covered by a non-conductive layer 116, which is on the surface 102 of the transparent material 100 and on the fourth surface 110 of the molding compound 106. The lip portion 112a is adjacent to edges of the surface 102 of the transparent portion 100 and the lip portion 112a recesses the surface 102 of the transparent layer 100 within the molding compound 106 of the package 80. The lip portion 112a at the inner sidewalls 112 surrounds the transparent layer 100. The lip portion 112a may be referred to as an extension, a protrusion, an extending portion, a protruding portion, or some other reference to a portion of the molding compound 106 that extends outward and past the surface 102 of the transparent layer 100 recessing the surface 102 within the molding compound 106.

In some embodiments, the lip portion 112a of the molding compound 106 is covered by the transparent layer 100 such that the fourth surface 110 of the molding compound 106 is substantially coplanar and flush with the surface 102 of the transparent layer 100, and the dimension $D_4$ is equal to the dimension $D_3$.

The non-conductive layer 116 may be a dielectric material, an insulating material, a passivation material, a repassivation material, or some other electrically non-conductive material or electrically insulating material. The non-conductive material 116 partially covers the fourth surface 110 of the molding compound 106 leaving an area 118 of the fourth surface 110 exposed. The area 118 is directly adjacent to the outer sidewalls 114 and is exposed to an external environment outside the package 80. The outer sidewalls 114 of the molding compound 106 are spaced outwardly from sidewalls 120 of the non-conductive material 116. In this embodiment of the package 80, the outer sidewalls 114 of the molding compound 106 partially form or completely form the sidewalls of the package 80. The sidewalls 120 may be ends of the non-conductive material 116 that are spaced inward from the sidewall 114 of the molding compound 106.

As shown in FIGS. 1A and 1, the non-conductive material 116 only partially covers the fourth surface 110 of the molding compound 106. However, in some other embodiments, the non-conductive layer 116 may entirely cover the fourth surface 110 of the molding compound 106. In these some other embodiments, the fourth surface 110 of the molding compound 106 is not exposed to the external environment outside the package 80. In these some other embodiments, the outer sidewalls 120 of the non-conductive layer 116 are aligned with the sidewalls 114 of the molding compound 106. In other words, the sidewalls 120 and the sidewalls 114 are flush and coplanar with each other, and the sidewalls 120, 114 form sidewalls of the package 80.

An opening 122 in the non-conductive layer 116 is aligned with the transparent layer 100 and the light sensor 98. The opening 122 exposes an area of the surface 102 of the transparent layer 100, and the opening 122 separates the non-conductive layer 116 into a first portion 116a and a second portion 116b that are on opposite sides of the opening 122. The first portion 116a includes an inner sidewall 124 on the surface 102 of the transparent layer 100, and the second portion 116b has an inner sidewall 126 spaced apart from and facing the inner sidewall 124 of the first portion 116a. The inner sidewalls 124, 126 of the first portion 116a and the second portion 116b are on the surface 102 of the transparent layer 100.

In some other embodiments, the non-conductive layer 116 may be continuous instead of separated into a first portion 116a and a second portion 116b. The continuous non-conductive layer 116 instead surrounds all sides of the opening 122. In other words, in these some other embodiments, the non-conductive layer 116 forms a perimeter around the opening 122 and is a continuous portion, instead of, the first portion 116a and the second portion 116b that are separate and distinct portions of the non-conductive layer 116 as shown in FIGS. 1A and 1B.

A dimension $D_5$ extends between the inner sidewalls 124, 126 of the first portion 116a and the second portion 116b of the non-conductive layer 116. The dimension $D_5$ is less than the dimension $D_1$ and is greater than the dimension $D_2$. The opening 122 in the non-conductive layer 116 has the dimension $D_5$. The opening 122 with the dimension $D_5$, which is larger than the dimension $D_2$ and less than the dimension $D_1$, allows for light from an external environment outside the package 80 to pass through the transparent layer 100 and be directed toward the light sensor 98 such that the light reaches the light sensor 98 without reflecting off other surfaces of the package 80.

The non-conductive layer 116 may be an opaque material similar to the molding compound 106 such that light cannot pass through the non-conductive layer 116. When the non-conductive layer 116 is opaque, the light cannot pass through the non-conductive layer and may only pass through the opening 122 to reach the light sensor 98 such that light entering the opening 122 and passing through the transparent layer 100 is directly focused on the light sensor 98.

The non-conductive layer 116 may be a single, non-conductive layer, or may be a plurality of stacked non-conductive layers that are a combination of various non-conductive passivation materials, non-conductive repassivation materials, dielectric materials, insulating materials, or some other electrically non-conductive material, electrically insulating material, or stacked combination thereof.

The non-conductive layer 116 includes an outer surface 128 that faces away from the die 90, the transparent layer 100, and the molding compound 106. The second portion 116b of the non-conductive layer 116 has a first thickness $T_1$ and a second thickness $T_2$ that are different from each other. The first thickness $T_1$ extends from the surface 102 of the transparent layer 100 to the outer surface 128 of the non-conductive layer 116. The second thickness $T_2$ extends from the fourth surface 110 of the molding compound 106 to the outer surface 128 of the non-conductive layer 116. The first thickness $T_1$ is greater than the second thickness $T_2$. The first portion 116a of the non-conductive layer 116 has the same or similar thicknesses as the first thickness $T_1$ and the second thickness $T_2$ as discussed with respect to the second portion 116b of the non-conductive layer 116, as discussed directly above.

The die 90 includes first contact pads 130 and second contact pads 132 at the first surface 92 of the die 90. The first contact pads 130 are further away from the light sensor 98 than the second contact pads 132. Ones of the first contact pads 130 and ones of the second contact pads 132 are coupled to and in electrical communication with the light sensor 98. The first contact pads 130 are fully covered by and overlapped by the non-conductive layer 116. As seen on the left-hand side of the light sensor 98 of FIG. 1A, ones of the second contact pads 132 are partially covered by and partially overlapped by the non-conductive layer 116. As seen on the right-hand side of the light sensor 98 of FIG. 1A, ones of the second contact pads 132 are fully covered and fully overlapped by the non-conductive layer 116. This partial covering, partial overlapping, fully covering, and fully overlapping of the non-conductive layer 116 over ones of the plurality of second contact pads 132 can be seen in FIG. 1B as well.

The package 80 includes conductive structures 134 that extend into the surface 102 of the transparent layer 100. Ones of the conductive structures 134 are on and coupled to first sides of ones of the plurality of first contact pads 130. The conductive structures 134 may be conductive pillars, conductive stubs, conductive columns, or some other references to an electrically conductive structure. The conductive structures 134 extend from first sides of ones of the first contact pads 130 into the non-conductive layer 116. The conductive structures 134 provide an electrical path through which electrical signals may pass or be communicated to and from the die 90.

In some other embodiments, ones of the conductive structures 134 may be on and coupled to first sides of ones of the second contact pads 132, or may be coupled to both the first sides of ones of the first contact pads 130 and ones of the second contact pads 132.

A redistribution layer (RDL) 136 is coupled to ends of the conductive structures 134 that are in the non-conductive layer 116. The RDL 136 may be a plurality of conductive layers (e.g., electrical traces, electrical connections, electrical pathways, etc.) that communicate electrical signals to and from the die 90 in combination with the conductive structures 134. The RDL 136 is entirely over the surface 102 of the transparent layer 100 based on the orientation of the package 80 in FIG. 1A.

In some other embodiments, the RDL 136 may be partially over the surface 102 of the transparent layer 100 and partially over the fourth surface 110 of the molding compound 106. In other words, the RDL may partially overlap the surface 102 of the transparent layer 100 and partially overlap the fourth surface 110 of the molding compound 106.

A plurality of bond pads 138 are on the surface 128 of the non-conductive layer and extend into the non-conductive layer 116 to the RDL 136. The plurality of bond pads 138 are electrically coupled to the RDL 136. The plurality of bond pads 138 may be a plurality of under-bump metallizations (UBMs), a plurality of contact pads, a plurality of mount pads, or some other type of conductive pad or conductive structure that can be utilized to electrically couple the package 80 to an external electrical component.

A plurality of first solder balls 139 are on and coupled to the plurality of bond pads 138. The plurality of solder balls 139 may be made of a solder material, a solder paste material, or some other electrically conductive material or combination of electrically conductive materials.

A plurality of through silicon vias (TSVs) 140 extend into the second surface 94 of the die 90. The plurality of TSVs 140 may be a plurality of conductive layers extending into the second surface 94 of the die 90. Ones of the plurality of TSVs 140 are coupled to second sides of ones of the first contact pads 130 and ones of the second contact pads 132. The TSVs 140 are in and surrounded by a non-conductive layer 142 that extends into the second surface 94 of the die 90. The non-conductive layer 142 is also on and covers the second surface 94 of the die 90 and the third surface 108 of the molding compound 106. The non-conductive layer 142 may be the same or similar as the non-conductive layer 116. The non-conductive layer 142 has an outer surface 143 that faces away from the die 90, the transparent layer 100, the molding compound 106, and the non-conductive layer 116. The outer surface 143 partially makes up an outer surface of the embodiment of the package 80 as shown in FIG. 1A. While the non-conductive layer 142 is shown as a single layer in FIG. 1A, in some embodiments, the non-conductive layer 142 may be a plurality of non-conductive layers that are stacked on each other to assist in the formation of the plurality of TSVs.

As shown in FIG. 1A, the non-conductive layer 142 fully or entirely covers the third surface 108 of the molding compound 106. However, in some embodiments, the non-conductive layer 108 may only partially cover the third surface 108 of the molding compound 106. For example, peripheral areas of the third surface 108 of the molding compound 106 may not be covered by the non-conductive layer 142 such that the peripheral areas of the third surface 108 are exposed.

A plurality of second solder balls 144 are coupled to exposed portions of the TSVs 140. The plurality of second solder balls 144 may be the same or similar as the plurality of first solder balls 139. The plurality of second solder balls 144 function in the same or similar manner as the plurality of first solder balls 139. Accordingly, for the sake of simplicity and brevity of the present disclosure, further details with respect to the second solder balls will not be discussed herein.

Figure 1C:
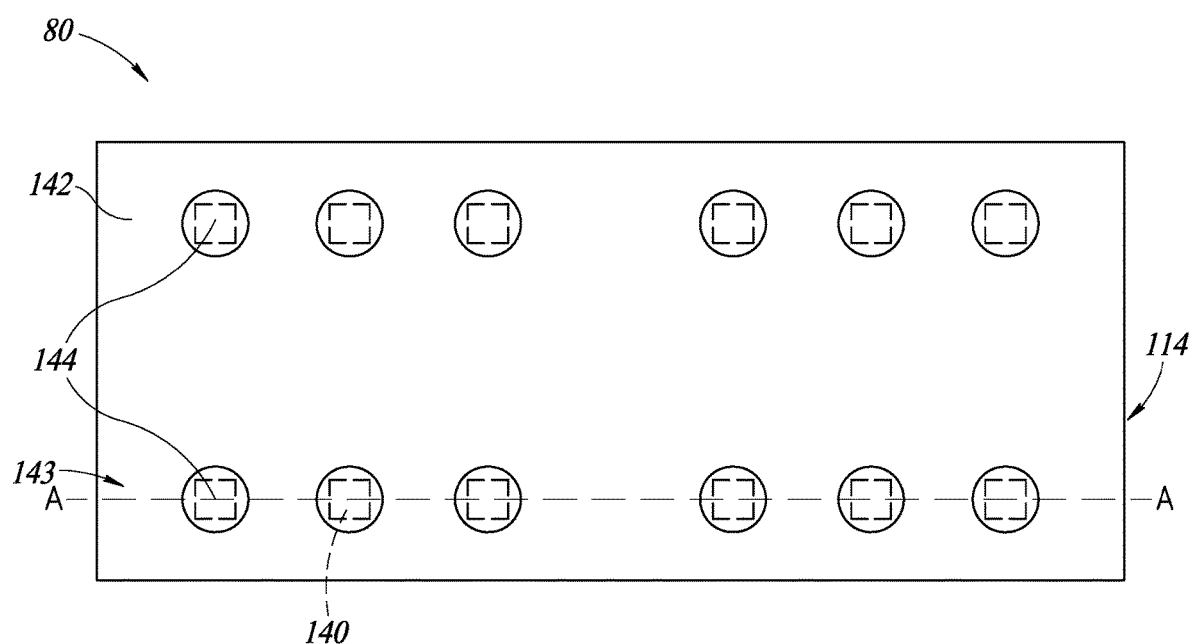
FIG. 1C is directed to a bottom-plan view of the embodiment of the package in FIGS. 1A and 1B.

FIG. 1B is a top-plan view of the embodiment of the package 80 in FIG. 1A, and FIG. 1C is a bottom-plan view of the embodiment of the package 80 in FIG. 1A.

Referencing FIG. 1B, the area 118 that is not covered by the non-conductive layer 116 surrounds the first portion 116a and the second portion 116b of the non-conductive layer 116. In other words, the area 118 surrounds the entirety of the non-conductive layer 116. In some embodiments, the area 118 may be made up of multiple areas that are separate and distinct from each other by the non-conductive layer 116. As shown in FIGS. 1A and 1B, the non-conductive layer 116 only partially covers the fourth surface 110, which leaves the area 118 of the fourth surface 110 exposed. However, in some embodiments, the non-conductive layer 116 may instead entirely cover the fourth surface 110 such that the area 118 of the fourth surface 110 is entirely covered by the non-conductive layer 116.

Figure 2A:
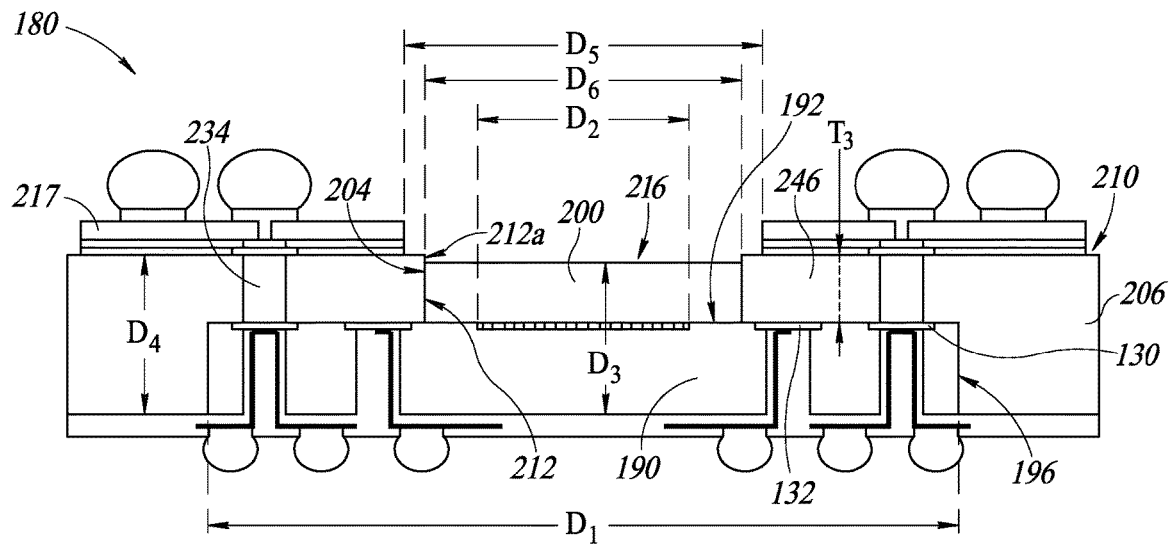
FIG. 2A is a cross-sectional view of an alternative embodiment of a package in taken along line B-B in FIG. 2B.

FIG. 2A is directed to an alternative embodiment of a package 180. The package 180 as shown in FIG. 2A includes the same or similar features as the package 80 as shown in FIG. 1A. For the sake of simplicity and brevity of the present disclosure, only additional, different, or new features of the package 180 as compared to the package 80 as shown in FIGS. 1A-1C will be discussed in further detail as follows.

A transparent layer 200 of the package 180 is similar to the transparent layer 100 of the package 80 as shown in FIG. 1A. However, unlike the transparent layer 100 of the package 80, the transparent layer 200 of the package 180 has a dimension $D_6$ that extends from opposite ones of a plurality of sidewalls 204 of the transparent layer 200. The plurality of sidewalls 204 of the transparent layer 200 are on a first surface 192 of a die 190 and are spaced inwardly from the sidewalls 196 of the die 190. The dimension $D_6$ of the transparent layer 200 is less than the dimension $D_1$ of the die 190 such that the transparent layer 200 is positioned on a central region of the die 190. The dimension $D_6$ of the transparent layer 200 is closer in value to the dimension $D_2$ of the light sensor 98 than the dimension $D_1$ of the die 190. The transparent layer includes a surface 216 that faces away from the die 190 and has the dimension $D_6$.

A molding compound 206 of the package 180 is similar to the molding compound 106 of the package 80 as shown in FIG. 1A. However, unlike the molding compound 106 of the package 80, the molding compound 206 of the package 180 is on and partially covers the first surface 192 of the die 190, is on and covers the first contact pads 130, and is on and partially covers the second contact pads 132. The molding compound 206 extends and protrudes outward past a surface 216 of the transparent layer 200. The surface 216 of the transparent layer 200 is similar to the surface 102 of the transparent layer 100 of the package 80, but unlike the surface 102 of the package 80, the surface 216 of the package 180 has the dimension $D_6$. The molding compound 206 is on and entirely covers the sidewalls 204 of the transparent layer 200. A portion 246 of the molding compound 206 is on the first surface 192 of the die 190 and has a third thickness $T_3$ that extends from the first surface 192 of the die 190 to a surface 210 of the molding compound 206. The portion 246 may be referred to as an extension portion, a protrusion portion, or some other type of portion of the molding compound 106 that is on the first surface 192 of the die. The surface 210 of the molding compound 206 of the package 180 is similar to the fourth surface 110 of the molding compound 106 of the package 80, but unlike the fourth surface 110 of the package 80, the surface 210 of the package 180 extends over and partially covers the first surface 192 of the die 190.

The surface 216 of the transparent layer 200 has a first surface area that is less than a second surface area of the first surface 192 of the die 190. In other words, the first surface area of the surface 216 fits within the second surface area of the first surface 192 of the die 190.

A plurality of conductive structures 234 of the package 180 are similar to the conductive structures 134 of the package 80 as shown in FIG. 1A. However, unlike the conductive structures 134 of the package 80, the conductive structures 234 of the package 180 extend into and through the molding compound 206 to reach first sides of ones of the first contact pads 130. The conductive structures 234 are surrounded by and are within the portion 246 of the molding compound 206 on the first surface 192 of the die 190.

A non-conductive layer 217 is on the surface 210 of the molding compound 206. The non-conductive layer 217 of the package 180 is similar to the non-conductive layer 116 of the package 80 as shown in FIG. 1A. However, unlike the non-conductive layer 116 of the package 80, the non-conductive layer 217 of the package 180 has a thickness that remains substantially the same along the entirety of the non-conductive layer 217, the non-conductive layer 217 is on the surface 210 of the molding compound 206, and the non-conductive layer 217 is not on the transparent layer 200.

The molding compound 206 includes a sidewall 212 that is the same or similar as the sidewall 112 as discussed with respect to FIG. 1A. For the sake of simplicity and brevity of the present disclosure, the discussion with respect to the sidewall 112 is not reproduced herein. However, unlike the sidewall 112 in FIG. 1A, the sidewall 212 is on the first surface 192 of the die 190.

The molding compound 206 includes a lip portion 212a that is the same or similar of the lip portion 112a as discussed with respect to FIG. 1A. For the sake of simplicity and brevity of the present disclosure, the discussion with respect to the lip portion 112a is not reproduced herein. However, unlike the lip portion 112a in FIG. 1A, the lip portion 212a is aligned with the sidewall 212 on the first surface 192 of the die 190.

While no bottom-plan view of the package 180 is shown, the bottom-plan view of the package 180 would look the same or similar to the bottom-plan view of the package 80 as shown in FIG. 1C. Accordingly, for simplicity and brevity sake of the present disclosure, the discussion with respect to the bottom-plan view of the package 80 as shown in FIG. 1C also applies to the bottom-plan view of the package 180, even though the bottom-plan view of the package 180 is not depicted or illustrated within the present disclosure.

Figure 3:
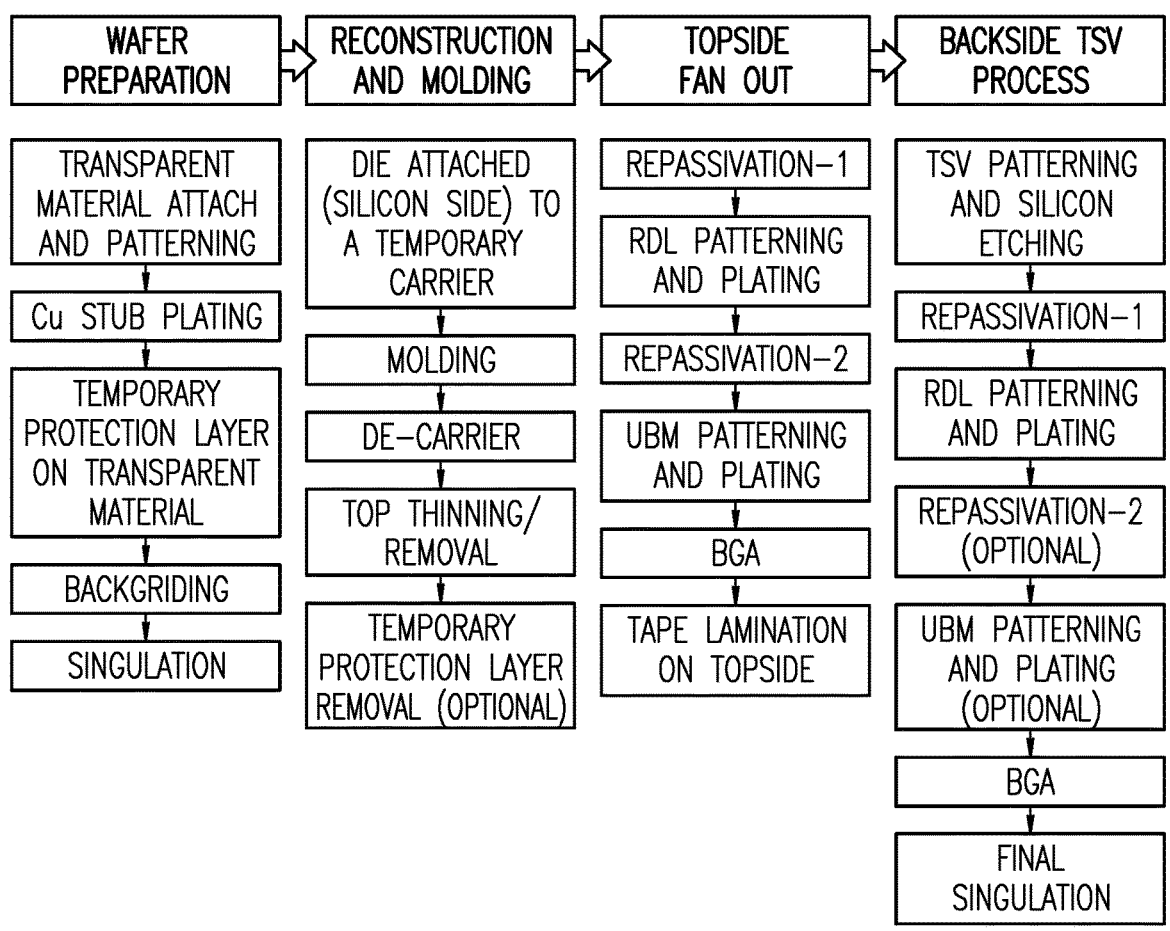
FIG. 3 is a flow chart diagram of an embodiment of a method of manufacturing the embodiment of the package in FIGS. 1A-1C.

FIG. 3 is a flow chart diagram of a preferred embodiment of a method of manufacturing 300 the package 80 as illustrated in FIGS. 1A-1C. FIGS. 4A-4K are directed steps in an embodiment of a method of manufacturing the package 80 as illustrated in FIGS. 1A-1C. The same or similar reference numerals for the package 80 in FIGS. 1A-1C will be utilized to refer to the same or similar features during the method of manufacturing 300 as depicted in FIGS. 4A-4K as follows.

As shown in FIG. 3, the steps under the header "Wafer Preparation" header are part of the "Wafer Preparation" process, the steps under the header "Reconstruction and Molding" are part of the "Reconstruction and Molding" process, the steps under the header "Topside Fan Out" are part of the "Topside Fan Out" process, and the steps under the header "Backside TSV process" are part of the "Backside TSV process."

While the flow chart diagram in FIG. 3 is a preferred order of the steps in forming the package 80 as illustrated in FIG. 1A-1C. It will be readily appreciated that these steps may be reordered to form the package 80. It will also be readily appreciated that FIGS. 4A-4K are directed to simplified steps based on the preferred embodiment of the order of steps in FIG. 3. While these steps are discussed in a specific order as follows the steps may be reordered to align more closely with the preferred embodiment as shown in FIG. 3 or may be reordered to from the package in some other embodiments of methods of manufacturing the package 80.

Figure 4A:
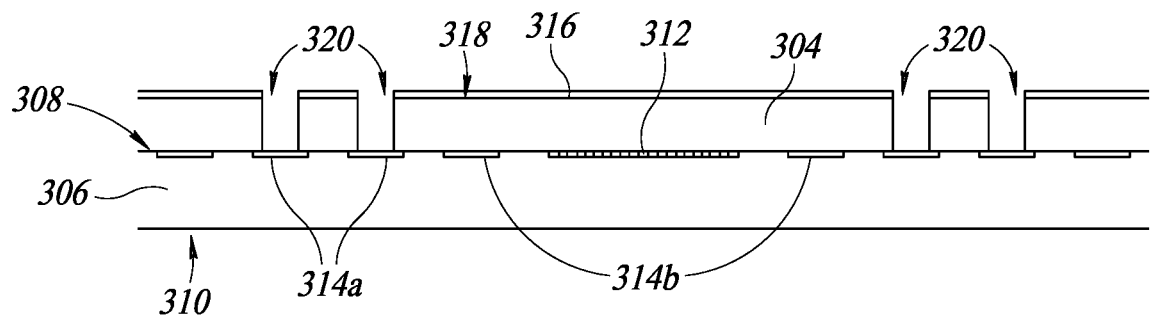
FIGS. 4A-4K are cross-sectional views taken along a line similar to the line A-A in FIG. 1A illustrating an embodiment of a method of manufacturing the embodiment of the package shown in FIGS. 1A-1C.

FIG. 4A is directed to a step of the method of manufacturing 300 the package 80 in which a transparent material 304 is formed on a substrate 306. The transparent material 304 is formed on a first surface 308 of the substrate 306. The transparent material 304 and the substrate 306 are utilized to form the die 90 and the transparent layer 100 of the package 80 as discussed earlier with respect to FIGS. 1A-1C. The step in FIG. 4A may be the "Transparent material Attach and Pattering" step during the "Wafer Preparation" process as shown in FIG. 3.

The transparent material 304 may be formed by a sputtering technique, an injection-mold technique, a compression-mold technique, or some combination of suitable techniques to form the transparent material 304 on the first surface 308 of the substrate 306. The first surface 308 is opposite to a second surface 310 of the substrate 306.

A sensor 312 and a plurality of contact pads 314a, 314b are at the first surface 308 of the substrate 306. The sensor 312 is the same or similar to the sensor 98 of the package 80 as discussed earlier with respect to FIGS. 1A-1C. Ones of the plurality of contact pads 314a, 314b is the same or similar as the contact pads 130, 132 as illustrated in FIGS. 1A-1C. The sensor 312 may be one of an array of sensors that are at the first surface of the substrate 306, and the plurality of contacts pads 314a, 314b may be ones of an array of contact pads on the first surface 308 of the substrate 306. The first surface 308 may be an active surface of the substrate 306 and the second surface 310 may be a passive surface of the substrate 306.

After the transparent material 304 is formed on the first surface 308, a hardmask layer 316 is formed on a surface 318 of the transparent material 304 that faces away from the substrate 306. The hardmask layer 316 may be formed by a similar technique utilized to form the transparent material 304 such as a sputtering technique, an injection-molding technique, a compression molding technique, a plating technique, or some other suitable technique for forming the hardmask layer 316.

After the hardmask layer 316 is formed to cover the surface 318, the hardmask layer 316 is patterned to expose areas or portions of the surface 318 of the transparent material 304 exposed. These exposed areas are surface areas that make up a piece, part, or portion of the entire surface area of the surface 318.

The hardmask layer may be patterned by a lasering-patterning technique, an etching-patterning technique, a photolithography-patterning technique, or some other suitable patterning technique for patterning the hardmask layer 316. For example, if the hardmask layer is formed by an etching-patterning technique, the hardmask layer 316 is selectively exposed to a chemical etchant at certain locations to remove portions of the hardmask layer 316. These portions of the hardmask layer 316 exposed to the chemical etchant are removed, dissolved, or deteriorated to expose partial surface areas of the surface 318 of the transparent material 304.

After the hardmask layer is formed and patterned, openings 320 are formed extending into the surface 318 of the transparent material 304 to the first surface 308 of the substrate 306. The openings 320 extend through the transparent material 304 and the hardmask layer 316. The openings 320 expose first ones 314a of the plurality of contact pads 314a, 314b at the first surface 308, and second ones 314b of the plurality of contact pads 314a, 314b remain covered by the transparent material 304. The first ones 314a of the plurality of contact pads 314a, 314b are positioned further away from the sensor 312 than the second ones 314b of the contact pads 314a, 314b. The first ones 314a are the same or similar to the contact pads 130 of package 80 as discussed earlier with respect to FIGS. 1A-1C. The second ones 314b are the same or similar to the contact pads 132 of the package 80 as discussed earlier with respect to FIGS. 1A-1C. The openings 320 may be recesses, trenches, apertures, cavities, or some other suitable structure to expose the first ones 314a of the plurality of contact pads 314a, 314b.

The openings 320 may be formed by a laser-drilling technique, a chemical etching technique, a water-jet etching technique, or some other suitable technique to form the openings 320 in the transparent material 304. For example, if the openings 320 are formed by a chemical etching technique, a chemical etchant is exposed to the partial surface areas that are not covered by the hardmask layer 316, and the chemical etchant removes, dissolves, and deteriorates portions of the transparent material 304 forming the openings 320. The chemical etchant for forming the openings 320 does not remove, dissolve, or deteriorate the hardmask layer 316.

After the openings 320 are formed in the transparent layer 304 exposing the first ones 314a of the plurality of contact pads 314a, 314b, a plurality or array of conductive structures 322 are formed in the openings 320. The plurality of conductive structures 322 are the same or similar to the conductive structures 134 of the package 80 as discussed earlier with respect to FIGS. 1A-1C. The plurality of conductive structures 322 extend into the surface 318 of the transparent material 304. Ones of the plurality of conductive structures 322 are coupled to the first ones 314a of the plurality of contact pads 314a, 314b.

In some other embodiments of the method of manufacturing 300 the package 80, openings 320 extending into the transparent material 304 may be formed by an injection formation technique in which a molding tool (not illustrated) has portions that protrude outward that form the openings 320 at the same time the transparent material 304 is formed on the first surface 308 of the substrate 306.

The plurality of conductive structures 322 may be formed by a sputtering technique, a plating technique, or some other suitable technique for forming the plurality of conductive structures 322 within the openings 320. For example, if the plurality of conductive structures are formed utilizing a plating technique, the transparent material 304, the substrate 306, the hardmask layer 316, and the openings 320 are positioned within an electrolytic solution (e.g., a bath of electrolytic solution), and, an electroplating or electrodeposition process is completed, forming the conductive structures 322 in the openings 320 and coupling the conductive structures to the first ones 314a of the plurality of contact pads 314a, 314b.

After the plurality of conductive structures 322 are formed in the openings 320 extending through the transparent material 304 and the hardmask layer 316, the hardmask layer 316 is removed. The hardmask layer 316 may be removed by a chemical etching technique, a grinding technique, or some other suitable technique. If the hardmask layer 316 may be made of a material that deteriorates or dissolves when the hardmask layer 316 is exposed to light.

After the hardmask layer 316 is removed, the surface 318 of the transparent material 304 is uncovered and exposed, and each of the plurality of conductive structures 322 has an end surface 324 that is spaced away from, apart from, and outwardly from the surface 318 of the transparent material 304. The end surfaces 324 are not flush and coplanar with the surface 318 of the transparent material 304.

Figure 4B:
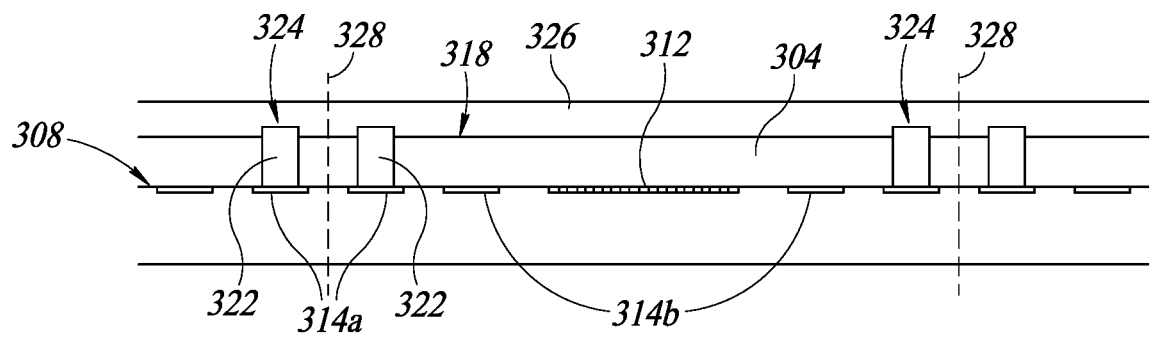

FIG. 4B illustrates forming a temporary protective layer 326 after the hardmask layer 316 is removed. The temporary protective layer 326 is formed on the surface 318 of the transparent material 304 and the end surfaces 324 of the plurality of conductive structures 322. The temporary protective layer 326 entirely or completely covers the surface 318 and the end surfaces 324. The temporary protective layer 326 may be a material that deteriorates when exposed to a selected chemical, to water, to heat, or to some other suitable quality that dissolves, deteriorates, and removes the temporary protective layer 326 from the surface 318 and the end surfaces 324. This deterioration or dissolving quality of the temporary protective layer 326 will be discussed in more detail later on with respect to FIG. 4E. The step in FIG. 4B may be the combination of "Cu Stub Plating," "Temporary Protection Layer on Transparent Material," and the "Singulation" steps during the "Wafer Preparation" process as shown in FIG. 3.

After the temporary protective layer 326 is formed on the surface 318 and the end surfaces 324, the transparent material 304, the substrate 306, and temporary protective layer 326 are singulated at locations designated by dotted lines 328. The singulation process may be completed by a laser, a saw, a drill, or some other suitable singulation tool or technique. This singulation forms a plurality of die assemblies 330, which can be seen in FIG. 4C as follows.

Figure 4C:
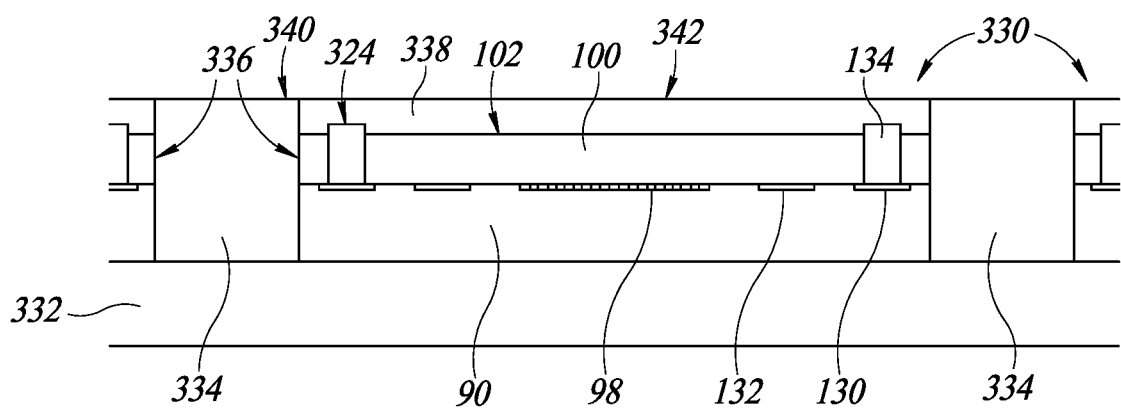

FIG. 4C illustrates coupling the plurality of die assemblies 330 to a temporary carrier 332. Each of the plurality of die assemblies 330 includes the die 90, the sensor 98, the contact pads 130, 132, the conductive structures 134, the transparent layer 100, and a temporary protective portion 338 covering the transparent layer 100 and the end surfaces 324 of the conductive structures 134. The step in FIG. 4C may be the combination of "Die Attached (Silicon Side) to a Temporary Carrier" and "Molding" steps during the "Reconstruction and Molding" process as shown in FIG. 3.

Each of the plurality of die assemblies 330 coupled to the temporary carrier are spaced apart from each other in an array-like manner, and the die assemblies 330 are spaced apart from each other by a plurality of trenches (not shown). The plurality of die assemblies 330 may be coupled to the temporary carrier 332 by a temporary adhesive such as a temporary die attach film, a temporary glue, or some other suitable temporary adhesive or temporary coupling technique. The temporary carrier 332 may be a kapton tape, a dummy wafer, a dummy substrate, or some other suitable temporary carrier upon which the plurality of die assemblies may be coupled.

After the plurality of die assemblies are coupled to the temporary carrier 332, a molding compound 334 is formed in the trenches positioned between adjacent ones of the die assemblies 330. The molding compound 334 completely covers the sidewalls 336 of the die assemblies 330. The sidewalls 336 of the die assemblies 330 are formed of the die 90, the transparent layer 100, and a temporary protective portion 338. The die 90, the transparent layer 100, and the temporary protective portion 338 are formed by the previous singulation process of singulating the substrate 306, the transparent material 304, and the temporary protective layer 326. The molding compound 334 has a surface 340 that is coplanar and flush with a surface 342 of the temporary protective portion 338. The surfaces 340, 342 face away from and are spaced apart from the temporary carrier 332.

The molding compound 334 may be formed by an injection-molding technique, a compression-molding technique, or some other suitable technique for forming the molding compound 334 in the trenches positioned between adjacent ones of the plurality of die assemblies 330 on the temporary carrier 332. For example, if the molding compound is formed by an injection-molding technique, a molding tool may be placed on the surfaces 342 of the temporary protective portions 338 and the molding compound 334 may be injected from a side opening of the trenches filling the trenches between the adjacent ones of the plurality of die assemblies 330. The molding compound 334 is then allowed to cure within the trenches and harden covering the sidewalls 336 of the die assemblies 330 while leaving the surfaces 342 of the temporary protective portions 338 uncovered. Once this formation of the molding compound 334 is complete, the surface 340 of the molding compound 334 is substantially coplanar and substantially flush with the surfaces 342 of the temporary protective portions 338. The molding compound 334 is utilized to form the molding compound 106 of the package 80.

Figure 4D:
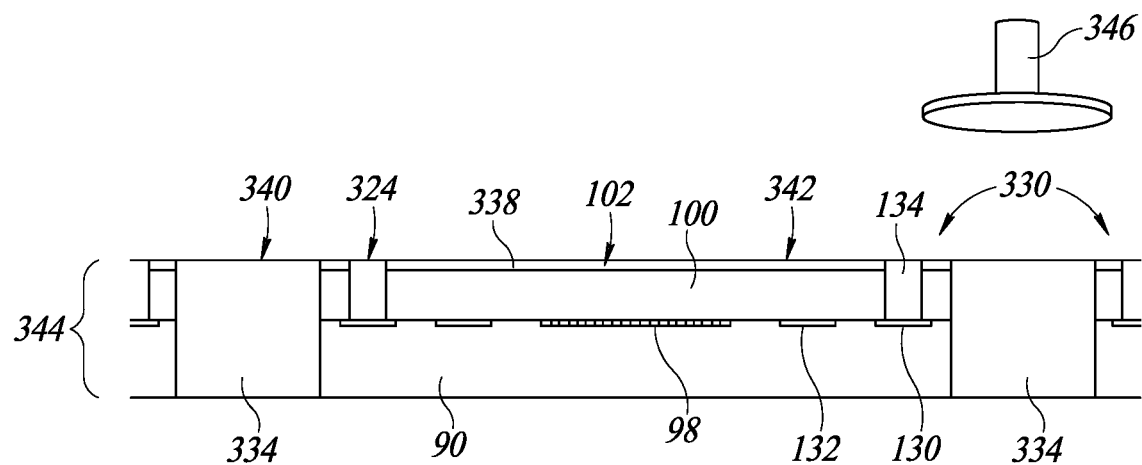

FIG. 4D illustrates removing the molding compound 334 and the die assemblies 330 from the temporary carrier 332 as well as grinding the temporary protective portions 338 and the molding compound 334. The step in FIG. 4C may be the combination of "De-Carrier" and "Top Thinning/Removal" steps during the "Reconstruction and Molding" process as shown in FIG. 3.

The die assemblies 330 and the molding compound 334 are removed from the temporary carrier 332. After the die assemblies 330 and the molding compound 334 are removed from the temporary carrier 332, the die assemblies 330 and the molding compound 334 are in the form of a wafer 344. After this removal process from the temporary carrier 332, the surfaces 340, 342 of the molding compound 334 and the temporary protective portions 338 are grinded. These surfaces 340, 342 are grinded by a grinding tool 346, which may be a diamond grinding wheel. The grinding tool 346 is moved along the surfaces 340, 342 grinding away material from the surfaces 340, 342 of the molding compound 334 and the temporary protective portions 338, respectively.

As shown in FIG. 4D, the grinding process partially grinds down the temporary protective layer 338 such that a portion of the temporary protective layer 338 is still present on the transparent layer 100. However, in some embodiments, the grinding process may fully remove the temporary protective layer 338 exposing the surface 102 of the transparent layer 100. In other words, in some embodiments, the grinding process may completely remove the temporary protective layer 338 such that the end surfaces 324 of the conductive structures 134, the surface 102 of the transparent layer 100, and the surface 340 of the molding compound 334 are substantially flush and coplanar with each other.

In some embodiments, the grinding process that is completed utilizing the grinding tool 346 may be completed by a different process and tool. For example, the different processes may be an etching process utilizing a chemical etchant, a polish process utilizing a polishing tool, a laser etching utilizing a laser, or some other type of material removal process.

After the grinding process is completed utilizing the grinding tool 346, the surfaces 340, 342 of the molding compound 334 and the temporary protective portions 338 are substantially coplanar and substantially flush with the end surfaces 324 of the conductive structures 134. The end surfaces 324 of the conductive structures 134 of the die assemblies 330 are exposed from the temporary protective portion 338 that was previously covering the end surfaces 324. In some other embodiments of the method of manufacturing the package 80, a laser tool may be utilized instead of the grinding tool 346 to partially and selectively remove portions of the molding compound 334 and the temporary protective portions 338. For example, similar to utilizing the grinding tool, the laser may be moved along the surfaces 340, 342 to dissolve or remove portions of the molding compound 334 and the temporary protective portions 338.

Figure 4E:
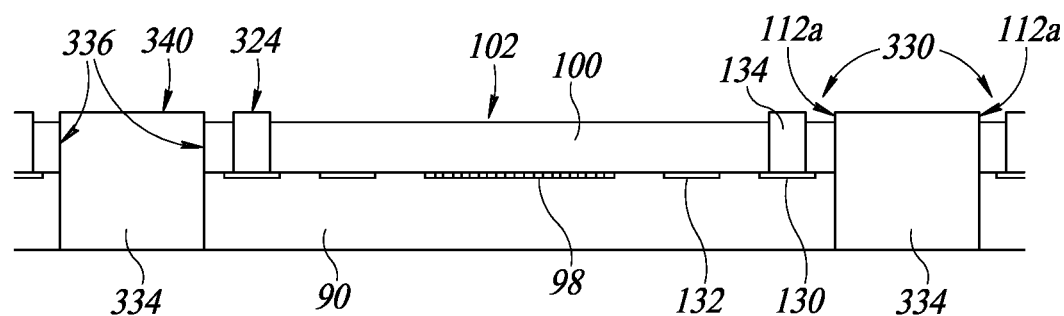

FIG. 4E illustrates removing the temporary protective portions from the surfaces 102 of the transparent layers 100 of the die assemblies 330. As the temporary protective portions 338 are formed from the temporary protective layer 326, the temporary protective portions 338 are made of the same material as the temporary protective layer and may be a material that deteriorates when exposed to a selected chemical, to water, to heat, or to some other suitable quality that dissolves, deteriorates, and removes the temporary protective layer 326 from the surface 318 and the end surfaces 324. For example, if the temporary protective portions 338 are made of a material that deteriorates when exposed to a temperature above a threshold, the temporary protective portions 338 may be dissolved or deteriorated to be removed from the surfaces 102 of the transparent layers 100 of the die assemblies 330 by exposing the temporary protective portions 338 to a temperature above the threshold. After the temporary protective portions 338 are removed, the molding compound 334 includes a plurality of lip portions 112a that extend and protrude away from the surfaces 102 of the transparent layers 100, and the conductive structures 134 of the die assemblies 330 extend and protrude away from the surfaces 102 of the transparent layers 100. The step in FIG. 4E may be the "Temporary Protection Layer Removal (Optional)" step during the "Reconstruction and Molding" process as shown in FIG. 3.

In some embodiments, the temporary protective layer 338 is fully removed by the grinding process as shown in FIG. 4D. When the temporary protective layer 338 is fully removed by the grinding process, the step in FIG. 4E is no longer necessary as a portion of the temporary protective layer 338 is no longer on the surface 102 of the temporary layer 100. Instead, the surface 102 of the transparent layer 100 is exposed by fully removing the temporary protective layer 338 during the grinding process as shown in FIG. 4D. In these embodiments, the surface 102 of the transparent layer 100 is substantially coplanar and flush with the end surfaces 324 of the conductive structures 134 and the surface 340 of the molding compound 334.

Figure 4F:
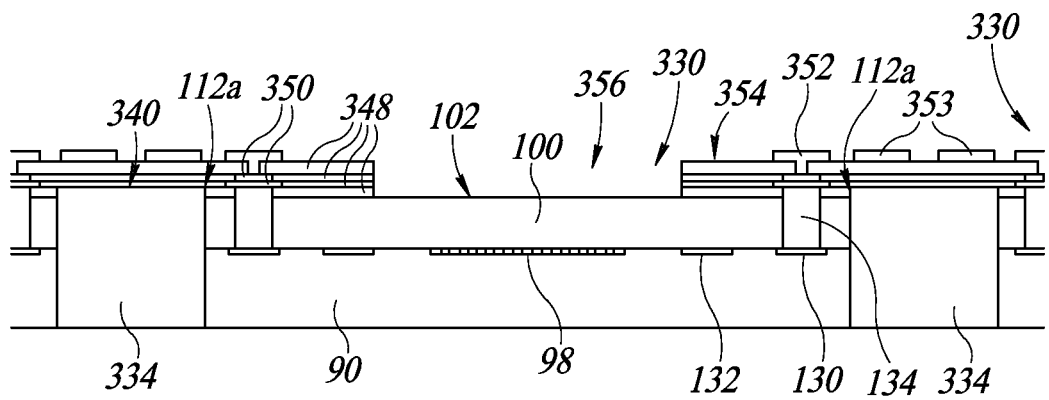

FIG. 4F illustrates forming a plurality of non-conductive layers 348 and a plurality of conductive layers 350. The plurality of non-conductive layers 348 are utilized to form the plurality of non-conductive layers 116, and the plurality of conductive layers 350 are utilized to form the RDL 136. The plurality of non-conductive layers 348 may be formed by a sputtering technique, an injection molding technique, or some other suitable deposition technique. Ones of the plurality of non-conductive layers 348 are patterned and the conductive layers are formed in the patterned non-conductive layers 348. The plurality of non-conductive layers 348 and the plurality of conductive layers 350 are formed at the same time and in sequence based on the stacked orientation of the non-conductive layers 348 and conductive layers 350. The step in FIG. 4F may be the combination of the "Repassivation-1," "RDL Patterning and Plating," and "Repassivation-2" steps during the "Topside Fan Out" process as shown in FIG. 3.

A plurality of first bond pads 352 are formed extending into the non-conductive layers 348 and are electrically coupled to the conductive layers 350. The conductive layers 350 electrically couple the first bond pads 352 to the conductive structures 134. The bond pads 352 are the same or similar to the bond pads 138. Some of the first bond pads 352 may be under bump metallizations (UBMs). The plurality of first bond pads 352 are on a surface 354 of the non-conductive layers 348 facing away from the sensors 98.

After the plurality of non-conductive layers 348 and the conductive layers 350 are formed, the plurality of non-conductive layers 348 are patterned to form openings 356 that are aligned with a corresponding one of the sensors 98. The openings 356 may be formed in a similar fashion as the openings 320 were formed as previously discussed earlier with respect to FIG. 4A. Alternatively, the openings 356 may be formed at the same time the non-conductive layers 348 and the conductive layers 350 are formed such that the non-conductive layers 348 and the conductive layers 350 are not formed at these locations aligned with the sensors 98 forming the openings 356. The openings 356 are the same or similar to the openings 122 as discussed with respect to FIG. 1A.

A plurality of second bond pads 353 are formed in a similar fashion as the bond pads 352. However, the second bond pads 353 are spaced further away from the openings 356 than the first bond pads 352. The plurality of second bond pads 353 may be coupled to other electrical traces and electrical connections within the non-conductive layers 348 even though these electrical traces and electrical connections are not shown in FIG. 4F.

Figure 4G:
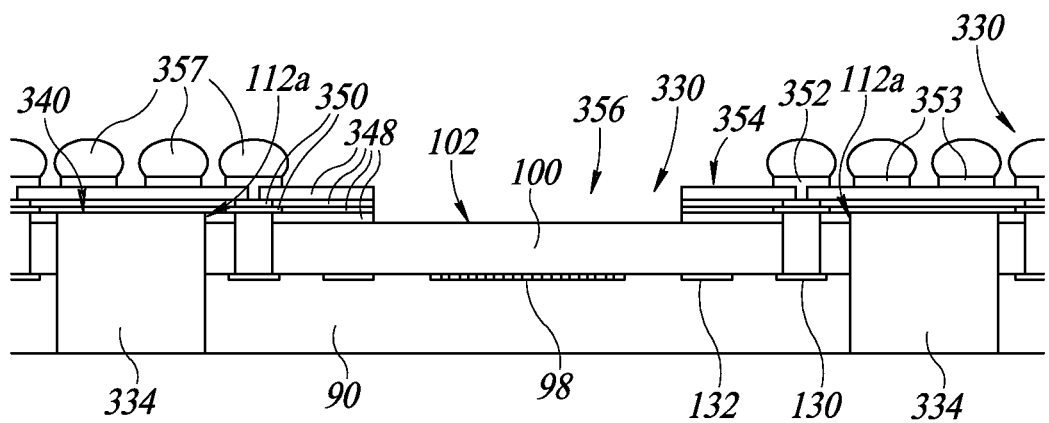

FIG. 4G illustrates forming a plurality of solder balls 357 on the first bond pads 352. The plurality of solder balls 357 are the same or similar to the solder balls 139 as discussed with respect to FIG. 1A. The plurality of solder balls 357 may be formed by a solder ball reflow technique or some other suitable technique for forming the solder balls 356 on the first bond pads 352. The step in FIG. 4G may be the "BGA" step during the "Topside Fan Out" process as shown in FIG. 3.

Figure 4H:
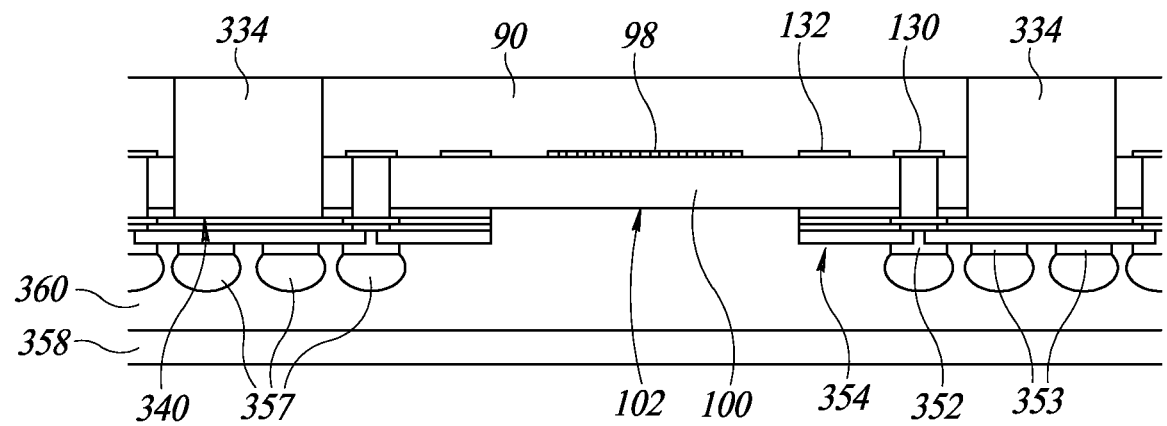

FIG. 4H illustrates flipping the wafer 344 and coupling the flipped wafer 344 to a temporary carrier 358 by an adhesive 360 on the temporary carrier 358. The temporary carrier 358 is the same or similar to the temporary carrier 332. The solder balls 356 and the non-conductive layers 348 are positioned on and within the adhesive 360. The wafer 344 may be flipped by a flip chip technique utilizing a pick and place machine or may be flipped utilizing some other suitable technique to flip the wafer 344. The wafer 344 may be coupled to the adhesive 360 using a pick and place machine or by some other suitable technique to couple the wafer 344 to the adhesive 360 on the temporary carrier 358. The step in FIG. 4H may be the "Tape Lamination on Topside" step during the "Topside Fan Out" process as shown in FIG. 3.

Figure 4I:
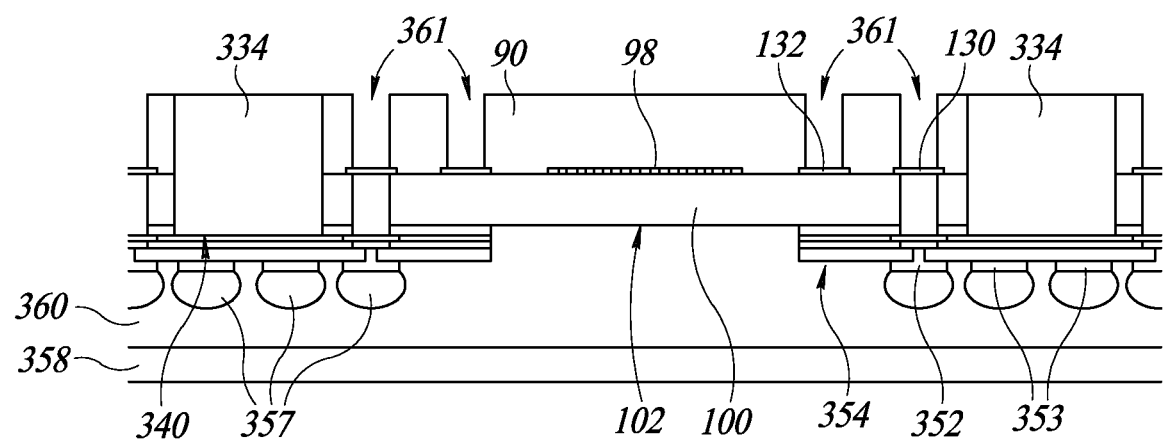

FIG. 4I illustrates forming openings 361 extending into and through each of the die 90 of the wafer 344 to a corresponding one of the contact pads 130 of each of the die 90. The openings 361 may be formed in the same or similar fashion as the openings 320 were formed as discussed with respect to FIG. 4A. The openings 361 expose second sides of the contact pads 130 that are opposite to first sides of the contact pads that were exposed by the openings 320 as discussed with respect to FIG. 1A. The step in FIG. 4I may be the "TSV Patterning and Silicon Etching" step during the "Backside TSV Process" as shown in FIG. 3.

Figure 4J:
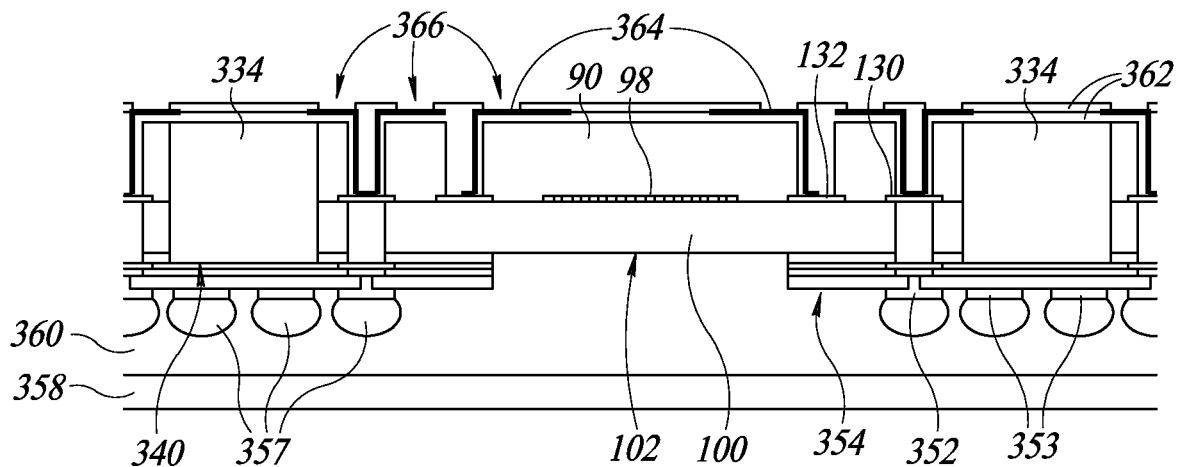

FIG. 4J illustrates forming at non-conductive layers 362 in the openings 361 and on the dice 90 and the molding compound 334 as well as forming a plurality of electrical vias or traces 364 within the non-conductive layer 362 in the openings 361. The non-conductive layers 362 and electrical vias 364 are formed in the same fashion as the non-conductive layers 348 and the conductive layers 350 as discussed with respect to FIG. 4G. After the non-conductive layers 362 and the electrical vias 364 are formed, the non-conductive layers 362 are patterned to form openings 361 that expose portions of the electrical vias 364. The openings 361 are formed in the same or similar fashion as the openings 320 as discussed with respect to FIG. 1A. The non-conductive layers 362 are the same or similar to the non-conductive layer 142, and the electrical vias 364 are the same or similar to the electrical vias 140. The step in FIG. 4J may be the combination of the "Repassivation-1," "RDL Patterning and Plating," and "Repassivation-2 (optional)" steps during the "Backside TSV Process" as shown in FIG. 3.

Figure 6:
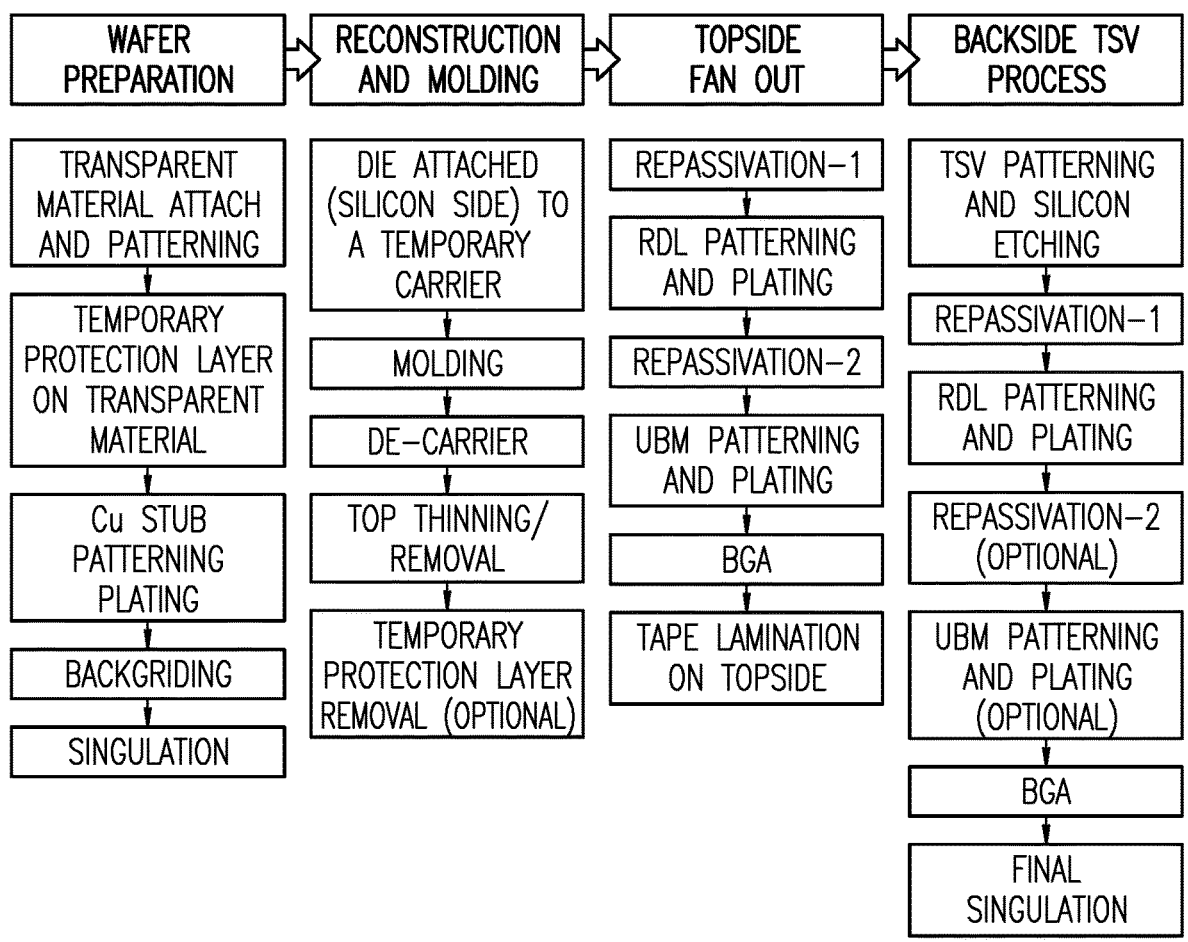
FIG. 6 is a flow chart diagram of the embodiment of the method of manufacturing the alternative embodiment of the package in FIGS. 2A and 2B.

In some embodiments, an optional "Repassivation-2" step and an optional "UBM Patterning and Plating" step as shown in FIG. 3 are carried out with respect to the "Backside TSV Process." In the optional "Repassviation-2" step, at least one more non-conductive layer may be formed on the non-conductive layers 362. The at least one more non-conductive layer is then patterned with openings. This discussion of the optional "Repassivation-2" step may also apply to the optional "Repassviation-2" step in as shown in FIG. 6.

After the optional "Repassviation-2" step is completed, the optional "UBM Patterning and Plating" step is carried out with respect to the "Backside TSV Process." In the optional "UBM Patterning and Plating" step, the openings in the at least one more non-conductive layer are filled with a conductive material coupling the conductive material to the TSVs 140. The conductive material may be formed in the openings by a plating process. The conductive material forms under-bump metallization's (UBMs) that are coupled to the TSVs 140. This discussion of the optional "UBM Patterning and Plating step" may also apply to the optional "Repassivation-2" step as shown in FIG. 6.

Figure 4K:
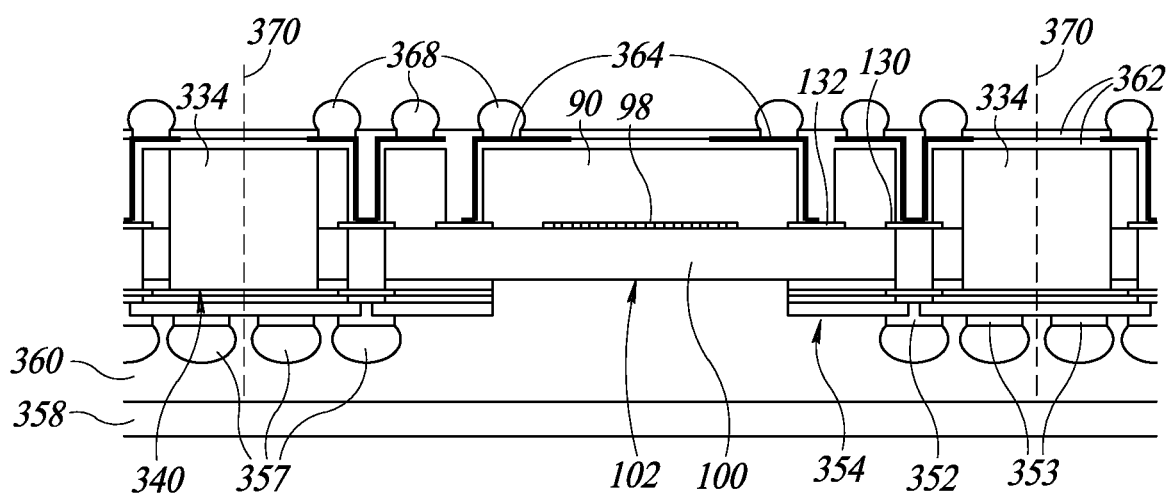

FIG. 4K illustrates forming a plurality of solder balls 368 in the openings 366 electrically coupling the plurality of solder balls 368 to the electrical vias 364. The plurality of solder balls 368 are formed in the same or similar fashion as the solder balls 357 as discussed with respect to FIG. 4G. However, unlike the plurality of solder balls 357, the plurality of solder balls 368 are smaller relative to the solder balls 356 formed on the opposite side of the wafer 344. The step in FIG. 4K may be the combination of the "BGA" and "Final Singulation" steps during the "Backside TSV Process" as shown in FIG. 3.

After the solder balls 368 are formed, the wafer 344 is singulated at locations designated by dotted lines 370 to form the packages 80, which may be removed from the adhesive 360 on the temporary carrier 358.

In some other embodiments of methods of manufacturing the packages 80, the solder balls 356, 368, as discussed with respect to FIGS. 4G and 4K, may not be formed and instead may be attached to the package 80 after the package 80 has been singulated.

In some embodiments of the methods of manufacturing the packages 80, as discussed above with respect to FIGS. 3 and 4A-4K, the removal of the temporary layer 334 may occur at different times of the method as shown in FIGS. 3 and 4A-4K.

In some embodiments, the temporary protective layer 338 may not be fully removed until one of the steps during the "Topside Fan Out" steps instead of during the steps that fall under the "Wafer Preparation," steps as shown in FIG. 3. For example, the temporary protective layer 338 may be removed during any of the steps of the "Topside Fan Out," process (e.g., "Repassivation-1," "RDL patterning and plating," "Repassivation-2," "UBM patterning and plating," "BGA," or "Tape Lamination on Topside" of the "Topside Fan Out" process as shown in FIG. 3). For example, unlike as shown in FIG. 4E in which the portion of the temporary protective layer 338 that remained after the grinding process as shown in FIG. 4D is removed, in some embodiments, the portion of the temporary protective layer 338 that remains after the grinding process may instead be later removed during one of the steps of the "Topside Fan Out." In other words, the removal of the portion of the temporary protective layer 338 that remains after the grinding process, which is illustrated in FIG. 3 by the "Temporary Protection Layer Removal," of the "Reconstruction and Molding" steps is optional such that this process may be carried out at a later time during the "Topside Fan Out," steps.

Figure 5:
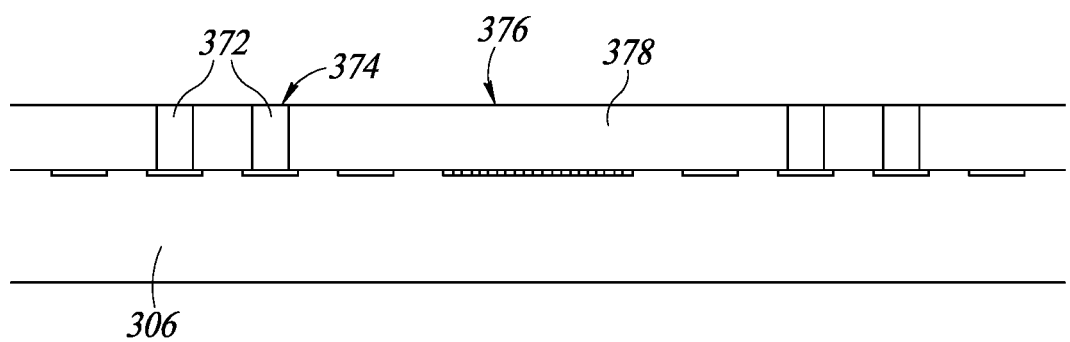
FIG. 5 is a cross-sectional view of an alternative embodiment of the present disclosure.

FIG. 5 is directed to an alternative embodiment of an alternative package. Unlike the package 80, a plurality of conductive structures 372 have end surfaces 374 that are flush with a surface 376 of a transparent layer 378. In this alternative embodiment, end surfaces 374 of the conductive structures 372 of the completed package will be spaced apart from the surface 376 of the transparent layer 378, and instead, the end surfaces 374 of the conductive structures 372 will remain substantially coplanar and substantially flush throughout the formation process of the completed package, and will be substantially flush and coplanar in the completed package.

Figure 2B:
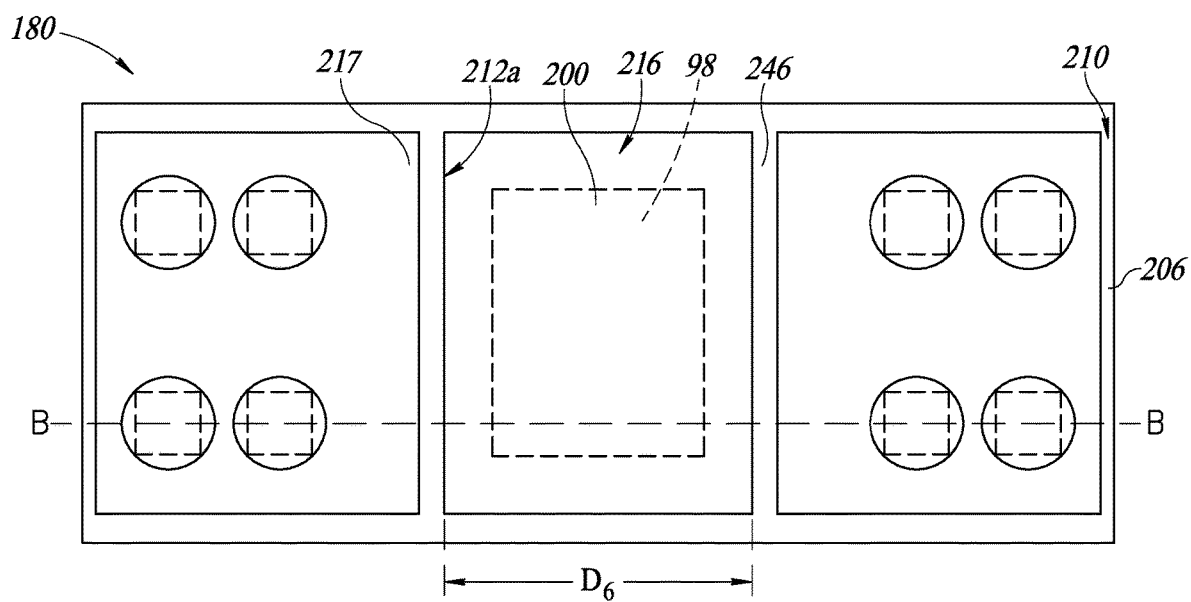
FIG. 2B is directed to a top-plan view of the alternative embodiment of the package as shown in FIG. 2A.

FIG. 6 is a flow chart diagram of a preferred embodiment of a method of manufacturing 400 the package 180 as illustrated in FIGS. 2A and 2B. FIGS. 7A-7E are directed to steps in an embodiment of a method of manufacturing of the package 180 as illustrated in FIGS. 2A and 2B. The same or similar reference numerals for the package 180 in FIGS. 2A and 2B will be utilized to refer to the same or similar features during the method of manufacturing 400 as depicted in FIGS. 7A-7E.

As shown in FIG. 6, the steps under the header "Wafer Preparation" header are part of the "Wafer Preparation" process, the steps under the header "Reconstruction and Molding" are part of the "Reconstruction and Molding" process, the steps under the header "Topside Fan Out" are part of the "Topside Fan Out" process, and the steps under the header "Backside TSV process" are part of the "Backside TSV process."

While the flow chart diagram in FIG. 6 is a preferred order of the steps in forming the package 180 as illustrated in FIGS. 2A and 2B. It will be readily appreciated that these steps may be reordered to form the package 180. It will also be readily appreciated that FIGS. 7A-7E are directed to simplified steps based on at least one embodiment of a method of manufacturing the package 180. While these steps are discussed in a specific order as follows the steps may be reordered to align more closely with the preferred embodiment as shown in FIG. 6 or may be reordered to from the package in some other embodiments of methods of manufacturing the package 180.

Figure 7A:
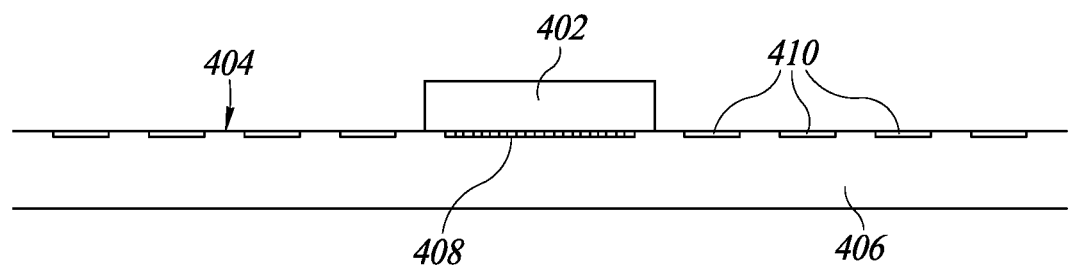
FIGS. 7A-7E are cross-sectional views taken along a line similar to the line B-B in FIG. 2A illustrating an embodiment of a method of manufacturing the alternative embodiment of the package in FIGS. 2A and 2B.

FIG. 7A is directed to a step of the method of manufacturing 400 the package 180 in which a transparent portion 402 is formed on a surface 404 of a substrate 406. The transparent portion 402 may be formed in the same or similar fashion as the transparent layer 304 as discussed with respect to FIG. 4A. Alternatively, the transparent portion 402 may be pre-formed and coupled to the surface 404 of the substrate 406 by a transparent adhesive. The transparent portion 402 is on a sensor 408, which is at the first surface 404 of the substrate 406. The transparent portion 402 is one of an array of transparent portions 402 on the substrate 406, and the sensor 408 is one of an array of sensors 408 at the surface of the substrate 406. Ones of the array of transparent portions 402 are on ones of the array of the sensors 408. For example, each transparent portion 402 of the array of transparent portions 402 is on a corresponding one of the sensors 408 of the array of sensors 408. The substrate 406 is utilized to form the die 190 in the package 180 and the transparent portions 402 on the substrate 406 are the same or similar to the transparent layer 200 as discussed with respect to the package 180 in FIG. 2A. The sensors 408 are the same or similar to the sensor 98 of the die 90 with respect to the package 180 as shown in FIG. 2A. The step in FIG. 7A may be the "Transparent material Attach and Pattering" step during the "Wafer Preparation" process as shown in FIG. 6.

The transparent portions 402 are formed on the surface 404 of the substrate 406 at areas of the surface 404 where ones of a plurality of contact pads 410 are not present. The plurality of contact pads 410 are at the surface 404. The plurality of contact pads 410 are the same or similar as the contact pads 130, 132 with respect to the package 180 as shown in FIG. 2A.

Figure 7B:
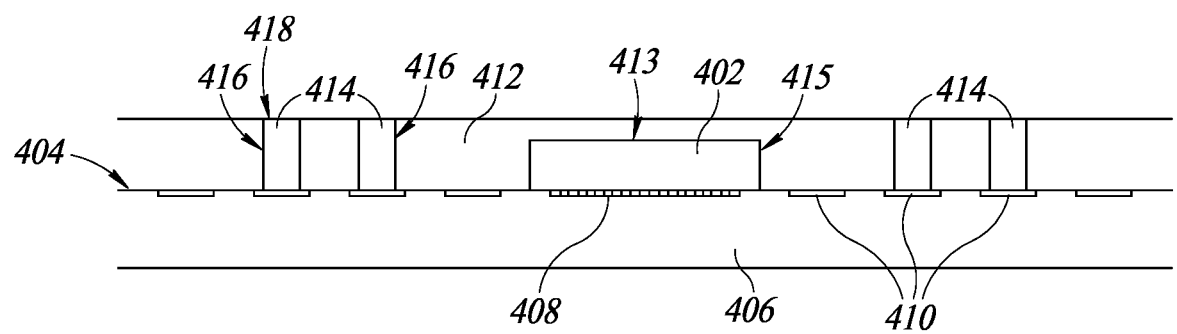

FIG. 7B illustrates forming a temporary layer 412 on the surface 404 of the substrate 406 and on surfaces 413 of the transparent portions 402. The temporary layer covers the surfaces 413 of the transparent portions 402, sidewalls 415 of the transparent portions 402, and sidewalls of the conductive structures 416. The temporary layer 412 is patterned with openings in which the conductive structures 414 are formed within, and the openings are aligned with and expose ones of the contact pads 410 such that the conductive structures 414 are coupled to ones of the contact pads 410. The openings patterned in the temporary layer 412 are formed in the same or similar fashion as the openings 320 as discussed with respect to FIG. 4B. The conductive structures 414 are formed in the openings in the temporary layer 412 in the same or similar fashion as the conductive structures 322 as discussed with respect to FIG. 4B. The conductive structures 414 are the same or similar to the conductive structures 234 with respect to the package 180 in FIG. 2A.

The step in FIG. 7B may be the "Cu Stub Patterning and Plating" step during the "Wafer Preparation" process as shown in FIG. 6.

The temporary layer 412 may be a material that deteriorates when exposed to a selected chemical, to water, to heat, or to some other suitable quality that dissolves, deteriorates, and removes the temporary layer 412 from the surface 404 of the substrate 406 and from sidewalls 416 of the conductive structures 414 after the conductive structures 414 are formed.

Figure 7C:
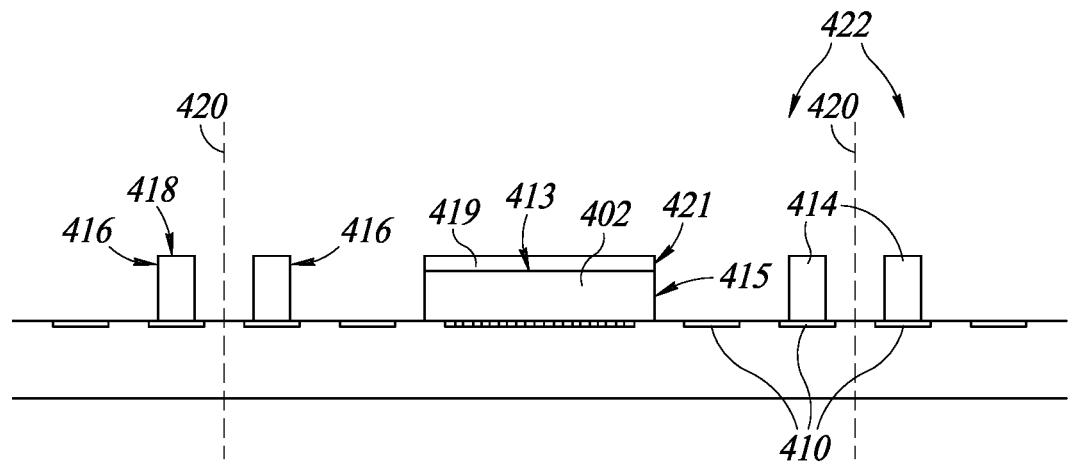

FIG. 7C illustrates removing the temporary layer 412, and, afterwards, forming a temporary protective layer 419 on the surface 413 on the transparent portion 402. For example, if the temporary layer is a material that dissolves and deteriorates when exposed to water, the temporary layer 412 is exposed to water and the temporary layer 412 dissolves and deteriorates such that the temporary layer 412 is removed from the sidewalls 415, 416 of the conductive structures 414 and the transparent portions 402, respectively, and is removed from the surfaces 413 of the transparent portions 402. The removal of the temporary layer 412 exposes the sidewalls 415 of the conductive structures 414, the sidewalls 416 of the substrate 406, and the first surface 404 of the substrate 406. The step in FIG. 7C may be the combination of the "Temporary Protection Layer on Transparent Material" and "Singulation" steps during the "Wafer Preparation" process as shown in FIG. 6. However, it will be readily appreciated that while the temporary protection layer is shown being formed after the conductive structures 414 in FIG. 7B, the temporary protective layer 419 may be formed in some embodiments before the conductive structures in the order of steps as shown in FIG. 6.

After the temporary layer 412 is removed, the temporary protective layer 419 is formed on the surface 413 of the transparent portion 402. The temporary protective layer 419 may be formed utilizing a sputtering technique or some other suitable deposition technique to form the temporary protective layer 419 on the surface 413 of the transparent portion 402. The temporary protective layer 419 includes sidewalls 421 that are substantially coplanar and flush with ones of the sidewalls 415 of the transparent portion 402.

The temporary protective layer 419 may be a material that deteriorates when exposed to a selected chemical, to water, to heat, or to some other suitable quality that dissolves, deteriorates, and removes the temporary protective layer 419 from the surface 413 of the transparent portion 402.

After the temporary protective layer 419 is formed on the surface 413 of the transparent portion 402, the substrate 406, the transparent portion 402, and the conductive structures are singulated at locations designated by dotted lines 420 into die assemblies 422. The singulation step is completed in the same or similar manner as the singulation step as discussed with respect to FIG. 4B.

Figure 7D:
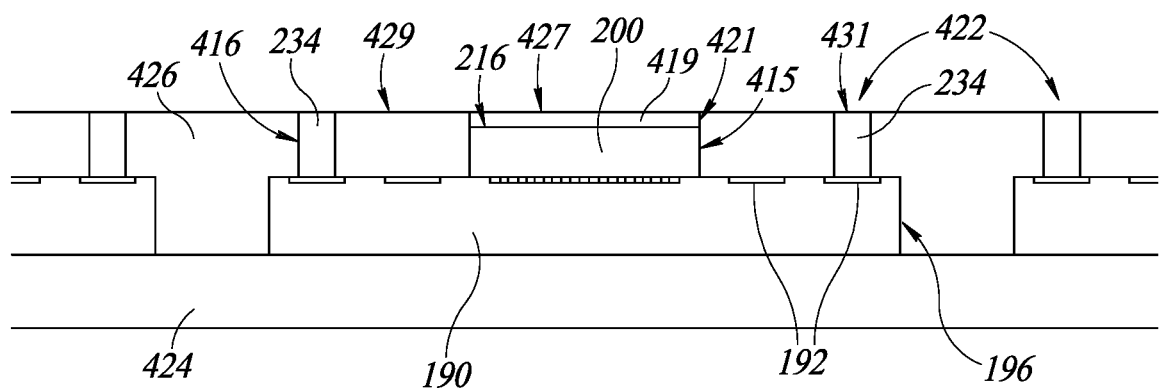

FIG. 7D illustrates coupling the die assemblies 422 to a temporary carrier 424. The die assemblies 422 are spaced apart from each other and trenches are positioned between adjacent ones of the die assemblies 422. After the die assemblies 422 are coupled to the temporary carrier 424, a molding compound 426 is formed in the trenches between the die assemblies 422. The molding compound 426 covers the sidewalls 416 of the conductive structures 234 of the die assemblies 422, the sidewalls 196 of the die 190 of the die assemblies 422, and sidewalls 421 of the temporary protective layer 419. End surfaces 431 of the conductive structures 234 and surfaces 427 of the temporary protective layers 419 are substantially coplanar and flush with a surface 429 of the molding compound 426. The end surfaces 431 of the conductive structures 234 are transverse to the sidewalls 416 of the conductive structures. The surfaces 427 of the temporary protective layers 419 are transverse to the sidewalls 421 of the temporary protective layers. The step in FIG. 7D may be the combination of the "Die Attached (Silicon Side) to a Temporary Carrier" and "Molding" steps during the "Reconstruction and Molding" process as shown in FIG. 6.

Ones of the die assemblies 422 include the die 190 and the transparent layers 200 as well as the conductive structures 234 as shown in the completed package 180 shown in FIG. 2A. As discussed earlier, the die 190 is formed utilizing the substrate 406, the transparent portions 402 are the same or similar as the transparent layers 200, and the conductive structures 414 are the same or similar to the conductive structures 234.

The temporary protective layer 418 has a surface 427 that is substantially coplanar and flush with a surface 429 of the molding compound 426. The end surfaces 431 of ones or all of the plurality of conductive structures 234 are substantially coplanar and flush with the surfaces 427, 429 of the temporary protective layer 418 and the molding compound 426, respectively.

Figure 7E:
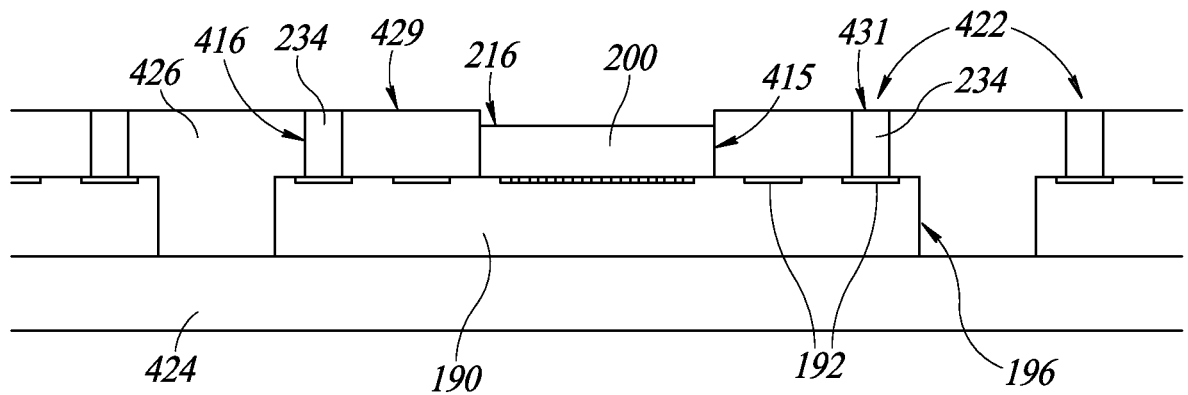

FIG. 7E illustrates removing the temporary protective layers 419 on the transparent layers 200 exposing the surfaces 216 of the transparent layers. For example, if the temporary protective layer 419 is a material that dissolves and deteriorates when exposed to water, the temporary protective layer 419 is exposed to water and the temporary layer 419 dissolves and deteriorates such that the surfaces 413 of the transparent portions 402 are uncovered and exposed. The step in FIG. 7E may be the "Temporary Protection Layer Removal (Optional)" step during the "Reconstruction and Molding" process as shown in FIG. 6.

In some embodiments, instead of the temporary protective layer 419 being fully removed by being dissolve, the temporary protective layer 419 may only be partially removed by a grinding process similar to as shown in FIG. 4D with respect to manufacturing the packages 80. For example, a portion of the temporary protective layer 419 may remain after this grinding process, and the portion of the temporary protective layer 419 that remains may be removed directly after the grinding process in a similar manner as discussed with respect to FIG. 7E, or may be later removed during one of the steps under the "Topside Fan Out," steps as shown in FIG. 6.

After the temporary protective layer is removed, the method of manufacturing 400 follows steps similar or the same as those depicted in FIGS. 4D-4K to manufacture the packages 180. For the sake of simplicity and brevity of the present disclosure, the discussion with respect to these steps to manufacture the packages 180 will not be discussed in further detail.

In some embodiments of the methods of manufacturing the packages 180, as discussed above with respect to FIGS. 6 and 7A-7E, the removal of the temporary layer 334 may occur at different times of the method as shown in FIGS. 6 and 7A-7E.

In some embodiments, a portion of the temporary protective layer 419, which remains after the step as shown in FIG. 7D, may not be removed until one of the steps during the "Topside Fan Out" steps instead of during the steps that fall under the "Wafer Preparation," steps as shown in FIG. 6. For example, the temporary protective layer 338 may be removed during any of the steps of the "Topside Fan Out," process (e.g., "Repassivation-1," "RDL patterning and plating," "Repassivation-2," "UBM patterning and plating," "BGA," or "Tape Lamination on Topside" of the "Topside Fan Out" process as shown in FIG. 3). For example, unlike as shown in FIG. 7E in which the temporary protective layer 338 is fully removed after the removal step of the temporary protective layer 419 as shown in FIG. 7E, in some embodiments, the temporary protective layer 419 the step in FIG. 7D may instead be later removed during one of the steps of the "Topside Fan Out" steps. In other words, the full removal of the temporary protective layer 419, which is illustrated in FIG. 6 by the "Temporary Protection Layer Removal," step of the "Reconstruction and Molding" steps, is optional at that time during the process such that the full removal of the temporary protective layer 419 may be carried out at a later time during the "Topside Fan Out," steps.

Figure 8:
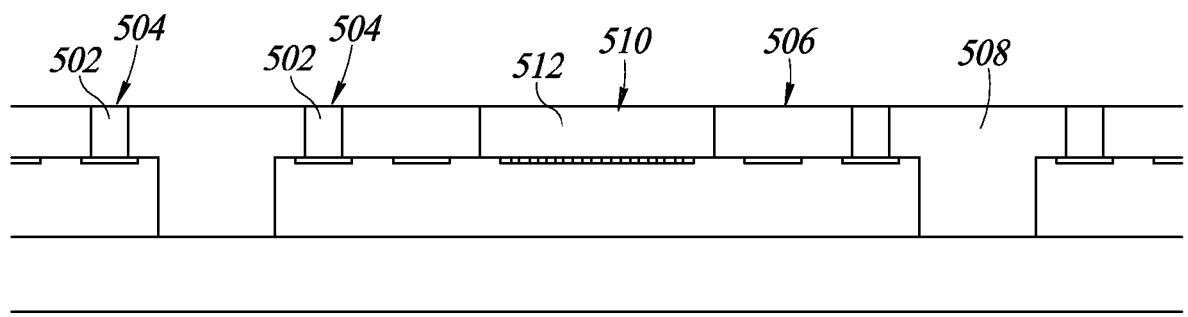
FIG. 8 is a cross-sectional view of an alternative embodiment of a package.

FIG. 8 is a step within an alternative embodiment of a method of manufacturing of an alternative embodiment of a package in which conductive structures 502 have end surfaces 504 that are substantially coplanar and substantially flush with a surface 506 of a molding compound 508 and a surface 510 of transparent portions 512. These surfaces 504, 506, 510 are made substantially flush and coplanar by not including the temporary protective layer 419 as illustrated in FIG. 7C. Otherwise, the steps as shown in FIGS. 4D-4K are followed in the same or similar fashion to form an alternative embodiment of a package similar to the package 180 as shown in FIGS. 2A-2C.

For example, to provide the structure as shown in FIG. 8, the temporary protective layer 419 as shown in FIG. 7D may have been on the transparent layer 512. However, in this process, the temporary protective layer 419, the molding compound 508, and conductive structures 502 may be grinded down with a grinding tool during a grinding process similar to that as shown in FIG. 4D, however, unlike FIG. 4D, the temporary protective layer 419 is fully removed by the grinding process. As a result of the temporary protective layer 419 being fully removed during the grinding process, the end surfaces 504 of the conductive structures 502 are exposed, and the end surfaces 504 of the conductive structures 502, the surface 506 of the molding compound 508, and the surface of the transparent layer 510 are substantially coplanar and flush with each other.

In view of the above discussion, the embodiments of the WLCSP within the present disclosure do not have electrical wires similar to the conventional WLCSP. Instead, in the WLCSPs of the present disclosure, the electrical connections (e.g., conductive structures, electrical vias, and contact pads of the die) are relatively short in length as compared to electrical wires and traces in the conventional WLCSPs. This relative shortness of the electrical connections within the WLCSPs disclosed herein, reduces the electrical resistance, electrical impedance, and parasitic inductance within the WLCSPs of the present disclosure. This reduction in these various characteristics reduces the effects of power integrity issues within the WLCSPs of the present disclosure as compared to the conventional WLCSPs. While this reduction in electrical resistance, electrical impedance, and parasitic inductance within a single WLCSP may seem relatively small within an electronic device that includes the WLCSPs of the present disclosure as a whole, as the number of WLCSPs within an electronic device or on a PCB increases, the combined effects of these multiple WLCSPs due to power integrity issues and noise caused by the combination of WLCSPs within the electronic device or on the PCB is vastly increased when multiple conventional WLCSPs are utilized instead of the embodiments of the WLCSPs of present disclosure.

Further, as the embodiments of the WLCSPs of the present disclosure do not include electrical wires similar to the conventional WLCSPs, the embodiments of the WLCSPs are relatively less thick than the conventional WLCSPs having electrical wires. Unlike electrical wires that take up significant amount of space within a package that cannot be utilized for other features, the embodiments of the WLCSPs have electrical connections formed by electrically coupling a conductive structure extending into a first side of a package to a first side of a contact pad of a die, and an electrical via that extends into a second side of a package opposite to the first side of the package to a second side of the contact pad of the die opposite to the first side of the contact pad. These electrical connections in the embodiments of the WLCSPs of the present disclosure extend directly through the WLCSPs and extend directly through the die. Accordingly, the amount of space provided to form the electrical wires within the package is large relative to the electrical connections of the embodiments of the WLCSPs that extend directly through the die and the package, which results in the embodiments of the WLCSPs being relatively less thick than conventional WLCSPs with electrical wires.

In view of the above discussion of the present disclosure, conventional WLCSPs with electrical wires and optical sensors generally cannot be stacked as conventional WLCSPs with electrical wires do not have electrical bonding pads exposed at both sides of the conventional WLCSPs. Unlike the conventional WLCSPs, the embodiments of the WLCSPs of the present disclosure have electrical bonding pads (e.g., exposed contact pads, under bump metallizations (UBMs), etc.) that are available on both sides of the embodiments of the WLCSPs that allow for the WLCSPs with optical sensors to be utilized in a stacked formation with other WLCSPs.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a die including:
      a sensor on a first surface of the die;
      a first contact pad adjacent to the sensor; and
      a second contact pad spaced further from the sensor than the first contact pad;
   a transparent layer on the first surface of the die, the transparent layer having:
      an exterior facing surface opposite the first surface of the die; and
      a first sidewall transverse the exterior facing surface;
   a molding compound around the die and the transparent layer, the molding compound having an outer surface that is further from the sensor than the exterior facing surface of the transparent layer, the first sidewall of the transparent layer contacting the molding compound;

a non-conductive layer including a plurality of stacked non-conductive layers, the non-conductive layer having:
  a second surface coplanar with the molding compound;
  a third surface coplanar with the transparent layer;
  a fourth surface opposite the second and third surfaces;
  a first thickness between the second and fourth surfaces; and
  a second thickness between the third and fourth surfaces, the first thickness is less than the second thickness; and
a conductive structure extending from the second contact pad through the transparent layer to the non-conductive layer.

2. The device of claim 1, further comprising:
a conductive layer extending through the non-conductive layer and coupled to the conductive structure, the conductive layer overlapping the exterior facing surface of the transparent layer, the non-conductive layer partially covers the exterior facing surface of the transparent layer and is on the outer surface of the molding compound.

3. The device of claim 2, further comprising a bond pad coupled to the conductive layer, the bond pad overlapping the exterior facing surface of the transparent layer.

4. The device of claim 2, further comprising an opening in the non-conductive layer partially exposing the exterior facing surface of the transparent layer.

5. The device of claim 4, wherein the transparent layer has a second sidewall opposite to the first sidewall, a first dimension along a first direction between the first and second sidewalls, the first dimension being greater than a second dimension of the opening along the first direction.

6. The device of claim 1, further comprising a conductive layer extending into a fifth surface of the die opposite the first surface of the die, the conductive layer being coupled to second the contact pad.

7. A device, comprising:
a die including:
  a first surface and a second surface opposite to the first surface;
  a plurality of first sidewalls that extend from the first surface to the second surface;
  a sensor at the first surface, the sensor having a first dimension that extends in a first direction transverse to the plurality of first sidewalls; and
  a conductive pad at the first surface;
a transparent layer on the first surface, the transparent layer having a second dimension extending in the first direction greater than the first dimension, and the transparent layer having a plurality of second sidewalls;
a molding compound on the plurality of first sidewalls of the die and on the plurality of second sidewalls of the transparent layer;
a non-conductive layer on and coplanar with the molding compound and the transparent layer, the non-conductive layer having a first thickness less than a second thickness, the first thickness being on the molding compound and the second thickness being on the transparent layer; and
a conductive structure extends into the transparent layer to the conductive pad.

8. The device of claim 7, wherein the plurality of first sidewalls of the die are coplanar with the plurality of second sidewalls of the transparent layer.

9. The device of claim 7, further comprising:
an opening that extends through the non-conductive layer to the transparent layer, the opening having a third dimension extending in the first direction greater than the first dimension and less than the second dimension.

10. The device of claim 7, wherein:
the molding compound includes:
  a third surface coplanar with the second surface of the die,
  a fourth surface opposite to the first surface, and
  a third dimension that extends in a second direction directed from the third surface to the fourth surface; and
the transparent layer includes a fifth surface opposite the first surface of the die, a fourth dimension that extends in the second direction between the fifth surface of the transparent layer and the second surface of the die, the fourth dimension being less than the third dimension.

11. A device, comprising:
a die including:
  a first surface and a second surface opposite to the first surface;
  a plurality of first sidewalls that extend from the first surface to the second surface;
  a contact pad at the first surface of the die; and
  a sensor at the first surface of the die;
a transparent layer on the first surface of the die, the transparent layer includes:
  a third surface on the first surface of the die and on the sensor;
  a fourth surface opposite the third surface and facing away from die; and
  a plurality of second sidewalls that that extend from the third surface to the fourth surface;
a conductive structure extending into the fourth surface of the transparent layer to the contact pad at the first surface of the die;
a molding compound is on and covers the plurality of first sidewalls and the plurality of second sidewalls;
at least one non-conductive layer stacked on the molding compound and the fourth surface of the transparent layer, the at least one non-conductive layer having a fifth surface opposite the first surface of the die, a first thickness between the fifth surface and the molding compound is less than a second thickness between the fifth surface and the transparent layer;
an insulating layer extends into the second surface to the contact pad of the die; and
an electrical via extends into the insulating layer to the contact pad and is coupled to the contact pad of the die.

12. The device of claim 11, wherein the plurality of first sidewalls is coplanar with the plurality of second sidewalls.

13. The device of claim 11, further comprising an opening extending into and through the at least one non-conductive layer to the fourth surface of the transparent layer, the opening being aligned with the sensor at the first surface of the die.

14. The device of claim 13, wherein:
the sensor has a first dimension extending in a first direction directed from respective opposite second sidewalls of the plurality of second sidewalls; and
the opening has a second dimension extending in the first direction, the second dimension being greater than the first dimension.

15. The device of claim 13, wherein the opening fully and completely overlaps the sensor.

16. The device of claim 11, further comprising a bond pad that is electrically coupled to the conductive structure and is on the at least one non-conductive layer.

17. The device of claim 16, further comprising:
a first solder ball coupled to an exposed portion of the electrical via exposed from the insulating layer; and
a second solder ball coupled to the bond pad.

18. The device of claim 11, wherein a plurality of third sidewalls of the at least one non-conductive layer are spaced inward from a plurality of fourth sidewalls of the molding compound.

19. The device of claim 11, wherein the at least one non-conductive layer includes a plurality of stacked non-conductive layers.

* * * * *